United States Patent [19]
Fujikawa et al.

[11] Patent Number: 5,685,907
[45] Date of Patent: Nov. 11, 1997

[54] APPARATUS FOR PREPARING COMPOUND SINGLE CRYSTALS

[75] Inventors: Takao Fujikawa; Katsuhiro Uehara; Yoshihiko Sakashita; Kazuya Suzuki, all of Takasago; Hiroshi Okada, Kobe; Takao Kawanaka, Kobe; Seiichiro Ohmoto, Kobe, all of Japan

[73] Assignee: Kabushiki Kaisha Kobe Seiko Sho, Kobe, Japan

[21] Appl. No.: 586,825

[22] PCT Filed: Jun. 1, 1995

[86] PCT No.: PCT/JP95/01069

§ 371 Date: Jan. 31, 1996

§ 102(e) Date: Jan. 31, 1996

[87] PCT Pub. No.: WO95/33873

PCT Pub. Date: Dec. 14, 1995

[30] Foreign Application Priority Data

Jun. 2, 1994 [JP] Japan ................................. 6-121456
Mar. 29, 1995 [JP] Japan ................................. 7-071862

[51] Int. Cl.⁶ ................................................. C30B 35/00
[52] U.S. Cl. .............................. 117/205; 117/81; 117/83
[58] Field of Search ......................... 117/2, 3, 81, 83, 117/900, 205

[56] References Cited

U.S. PATENT DOCUMENTS

| | | | |
|---|---|---|---|
| 4,083,748 | 4/1978 | Gault | 117/77 |
| 4,853,066 | 8/1989 | Yoshida et al. | 117/82 |
| 4,909,998 | 3/1990 | Nishizawa | 117/223 |
| 5,167,759 | 12/1992 | Omino | 117/83 |

FOREIGN PATENT DOCUMENTS

| | | |
|---|---|---|
| 60-255690 | 12/1985 | Japan . |
| 62-59591 | 3/1987 | Japan . |
| 0137487 | 2/1989 | Japan . |
| 4 77383 | 3/1992 | Japan . |
| 5 70276 | 3/1993 | Japan . |

*Primary Examiner*—Felisa Garrett
*Attorney, Agent, or Firm*—Oblon, Spivak, McClelland, Maier & Neustadt, P.C.

[57] ABSTRACT

A method and apparatus for the preparation of single crystals of group II–VI compounds such as ZnSe and CdTe and group III–V compounds such as InP and GaP or of ternary compounds thereof, from which some of their components are likely to be dissociated and evaporated during crystal growth at high temperatures. Single crystals are prepared which enable the preparation of high quality compound single crystals and prevent the contamination of furnace structures. The method includes melting a source material in a container by heating in a furnace body and solidifying the melt by cooling from the bottom to grow a single crystal. The container is enclosed by an airtight chamber communicating to the outside with a pressure equalizing passage. Heating is performed while the passage is held at a low temperature equal to or lower than the melting point of a high-dissociation-pressure component of the source material. The apparatus includes a container for holding the source material, a hermetical furnace body including a heater to heat the container, an airtight chamber inside the heater which encloses the container and a pressure equalizing passage communicating with the airtight chamber and forming a lower portion of the chamber.

11 Claims, 15 Drawing Sheets

APPARATUS FOR PREPARING COMPOUND SINGLE CRYSTALS

BACKGROUND OF THE INVENTION

1. Field of the Invention

The present invention relates to a method and apparatus for preparing single crystals of group II-VI compounds such as ZnSe and CdTe and group III-V compounds such as InP and GaP or of ternary compounds thereof, from which some of their components are easily dissociated and evaporated during crystal growth at high temperatures.

2. Discussion of the Background

As substrates for use in epitaxial growth required to fabricate light-emitting devices such as a light-emitting diode and a semiconductor laser, there have been used single-crystal substrates of group II-VI compounds such as ZnSe, CdTe and ZnS or of group III-V compounds such as InP, GaP and BaAs, depending on the type of the device to be fabricated.

To prepare single crystals of such compounds, various methods have been proposed including liquid-encapsulated Czochralski (LEC) method, horizontal Bridgman (HB) method, vertical gradient freeze (VGF) solidifying method, and vertical Bridgman (VB) method. Of these methods, the VGF and VB methods have been considered to be remarkably promising methods on an industrial scale, since these methods enable the preparation of high-quality single crystals which are comparatively large in size and present less transformation.

In the VGF method, ring-shaped heaters in multiple stages provided in a furnace are so controlled as to form a temperature distribution in the furnace which ranges, with lowering position in the furnace, from a high temperature to a low temperature through the melting point of the compound used. By shifting the melting point zone in the temperature distribution upward from a lower position to a higher position, a source material melt in a crucible placed inside the heaters is gradually solidified from its bottom portion in contact with a seed crystal to obtain a single crystal grown.

The VB method is similar to the above-mentioned VGF method in that heaters in multiple stages are so controlled as to form a vertical temperature distribution. In the VB method, however, a crucible is moved downward to pass through the melting point zone, thereby gradually solidifying the source material melt in the crucible from its bottom portion in contact with a seed crystal to allow a single crystal to grow.

In preparing single crystals of the foregoing compounds by the VGF method or VB method, however, a specific component having a high equilibrium dissociation pressure (hereinafter referred to as a high-dissociation-pressure component) is easily dissociated from the source material melt and evaporated, resulting in a single crystal having a composition varied from an intended one. To alleviate such a variation in composition resulting from the dissociation and evaporation of the high-dissociation-pressure component, Japanese Unexamined Patent Publication HEI 5-70276, for example, has disclosed a method in which a crucible is hermetically sealed in an air-tight vacuum container such as a quartz ampule, thereby growing a single crystal while preventing the high-dissociation-pressure component from being evaporated from the source material melt in the crucible.

With the foregoing method, however, operations of hermetically sealing the crucible in the airtight vacuum container and further opening the sealed container after the growth of the single crystal are extremely intricate. Moreover, if the airtight container is of completely hermetic type, a pressure difference is produced between the inside and outside of the container when the high-dissociation-pressure component is evaporated until the pressure thereof reaches an equilibrium dissociation pressure. Such a pressure difference results in a force acting on the airtight container which may damage the same.

Japanese Unexamined Patent Publication HEI 4-77383 discloses an apparatus in which an airtight container enclosing a crucible is provided in a high-pressure container serving as a furnace to be filled with an inert gas at a high pressure and a pressure buffer passage for pressure equalization is provided to the airtight container so as to reduce a pressure difference between the inside and outside thereof.

Where a group II-VI or group III-V compound or a compound containing the same as its main component, the pressure buffer passage is located in an upper portion of the airtight container in order to keep vapor of the high-dissociation-pressure component remaining in the container and to preferentially discharge the inert gas out of the container, as disclosed in the description from line 13 in the lower left section to line 2 in the lower right section on page 4 of the above publication, since the vapor of the high-dissociation-pressure component of the compound has a molecular weight larger than that of the inert gas for pressurization.

However, since the gas in the upper portion of the airtight container is at high temperatures and hence has high kinetic energy, the vapor of the high-dissociation-pressure component are likely to leak out of the container through the pressure buffer passage. To prevent the vapor from leaking out, the pressure buffer passage is configured into a winding passage of complicated, labyrinthine structure, as disclosed in the description from line 18 in the lower right section of page 5 to line 7 in the upper left section of page 6 and in FIG. 2 of the aforesaid publication.

Moreover, the vapor of the high-dissociation-pressure component is discharged out of the airtight container through the pressure buffer passage in the process of reaching the equilibrium pressure state, as disclosed in the description in lines 3 to 7 in the upper right section of page 4 and in lines 13 to 15 in the lower right section of page 4 of the publication. Since the discharged vapor of the high-dissociation-pressure component is at a high temperature, it adheres to and is deposited on the entire surfaces of the heaters surrounding the airtight container and of an electrode for supplying power thereto. As the apparatus is used repeatedly, the layer of the deposited high-dissociation-pressure component gradually grows. In most cases, the high-dissociation-pressure component typically used is a conductive material or a semiconductor material, so that the power supplied to the heaters fluctuates due to the deposition and growth of the layer of the high-dissociation-pressure component, resulting in a instable heating temperature. In serious cases, the heater electrode is short-circuited via the layer of the deposit, which disenables the operation.

Japanese Unexamined Patent Publication HEI 3-247582 has disclosed an apparatus shown in FIG. 15, in which a susceptor 83 for supporting a crucible 82 is mounted on the upper end of a vertical drive shaft 81 in a vertical temperature gradient furnace. The lower portion of the susceptor 83 is circumferentially formed with a recessed receptacle 85 for receiving a liquid sealing agent 84, so that an airtight chamber 86 is hermetically sealed by immersing the lower end of the airtight chamber 86 enclosing the crucible 82 in the liquid sealing agent 84. As the liquid sealing agent 84, boric oxide ($B_2O_3$) which is liquefied when heated to a high temperature is mentioned as an example.

In the above apparatus, a space for accommodating the high-dissociation pressure component 87 is further provided above the susceptor 83. The temperature in the space is detected by a thermocouple 88 so as to control the vapor pressure of the high-dissociation-pressure component 87 by controlling the heater 89 on the basis of a detected temperature signal.

Where a compound semiconductor crystal is grown using the aforementioned apparatus, the crucible 82 with a seed crystal 90 inserted into the lower end portion thereof is filled with a source material. After setting the crucible 82 in the furnace as shown in the drawing, the source material is melted by heating. Thereafter, a predetermined temperature gradient dropping with lowering position in the furnace is provided for cooling a source material melt 91 in the crucible 82, so that the source material melt 91 is solidified from the bottom portion thereof to grow a single crystal 92.

The dissociation during the operation of crystal growth is stopped when the vapor pressure of the high-dissociation-pressure component in the hermetically sealed airtight chamber 86 reaches the equilibrium vapor pressure. Therefore, the apparatus is constructed so that the amount of the evaporated dissociated-pressure component is reduced by the airtight chamber 86 with a reduced inner space. In the case where a pressure difference is produced between the inside and outside of the airtight chamber 86 due to the thermal expansion of the gas or the evaporation of the high-dissociation-pressure component, each caused by heating, the pressure difference varies the liquid level of the liquid sealing agent 84, resulting in the formation of a gas flow path in the recessed receptacle 85, which provides communication between the inside and outside of the airtight chamber 86. Consequently, an excessively large force resulting from the pressure difference does not act on the airtight chamber 86, whereby the airtight chamber 86 is prevented from being damaged.

With the foregoing apparatus, however, the vapor of the high-dissociation-pressure component which have varied the liquid level of the liquid sealing agent 84 and leaked out of the airtight chamber 86 are diffused in the space outside the airtight chamber 86. The diffused vapor is then precipitated by contact with a heater 89 disposed adjacent the outside space or with a member for supplying power thereto, as described above, which may cause an accident resulting from a short circuit or the like. Furthermore, since the entire internal surface of the furnace is contaminated by the diffused vapor, an enormous amount of labor is required, when occasion demands, to carry out maintenance operations such as disassembling the structure in the furnace and cleaning the furnace. This results a problem of unsatisfactory production efficiency and hence reduced productivity.

SUMMARY OF THE INVENTION

The present invention has been achieved in view of the foregoing problems essential to the prior art. It is, therefore, an object of the present invention to provide a method and apparatus for preparing compound single crystals which enable the preparation of compound single crystals of higher quality and prevent the contamination of the structure including a heater disposed in the furnace, thereby improving the productivity.

According to the present invention, there is provided a method of preparing compound single crystals comprising the steps of: melting a source material in a source material container by heating with a heating means incorporated in a furnace body, the source material container being disposed inside the heating means; and solidifying the source material melt by cooling from its bottom so as to grow a single crystal therefrom, wherein the source material container is enclosed by an airtight chamber impervious to gas which is disposed inside the heating means, the inside and outside of the airtight chamber communicating with each other through a pressure equalizing passage formed below the heating means, and the heating of the source material in the source material container is performed, while at the same time a region of the pressure equalizing passage is held at a low temperature equal to or lower than the melting point of a high-dissociation-pressure component of the source material, so as to allow the single crystal to grow.

Preferably, the single crystal growth is performed by heating the source material while holding the pressure of an inert gas supplied into the furnace body to provide an inert gas atmosphere therein at a pressure equal to or higher than the dissociation pressure of the source material compound.

The single crystal growth can be performed with the source material container being supported by an upper portion of a lifting rod by vertically moving the lifting rod in the airtight chamber so as to shift a melting point zone of a temperature distribution in the furnace body from a position below the source material container to a position above the source material container.

Furthermore, it is preferable that the single crystal growth be performed by providing in the airtight chamber a reservoir for containing the high-dissociation-pressure component of the source material and heating the source material in the source material container while heating the reservoir to generate vapor of the high-dissociation-pressure component.

It is possible that the single crystal growth is performed by further providing in the airtight chamber an airtight container for hermetically accommodating the source material container, the airtight container being provided with an open/close valve means which opens and closes depending on a pressure difference between the inside and outside of the airtight container to form a gas flow path, placing the source material container in the above airtight container, and heating the source material in the source material container. In this case, it is preferred to grow the single crystal by further providing a reservoir for containing the high-dissociation-pressure component of the source material in the airtight container and heating the source material in the source material container while heating the reservoir to generate vapor of the high-dissociation-pressure component.

Preferably, the single crystal is generated by heating the source material in the source material container by the heating means while heating the high-dissociation-pressure component in the reservoir by a subordinate heating means for heating the reservoir to a temperature equal to or lower than the temperature at which the heating means heats the source material.

Preferably, cooling is performed after solidification of the entire source material in the source material container, while producing from the reservoir a vapor pressure equal to or higher than the dissociation pressure of the high-dissociation-pressure component of the crystal thus obtained.

An apparatus for preparing compound single crystals according to the present invention, which is suitable for implementing the above method, comprises: a source material container for containing a source material; a hermetical furnace body incorporating therein a heating means for heating the source material container from therearound and formed with a gas supply/exhaust passage connected to the outside of the furnace body; an airtight chamber impervious to gas which is disposed inside the heating means so as to enclose the source material container; and a pressure equalizing passage for providing communication therethrough between an internal space enclosed by the airtight chamber and the outside of the airtight chamber, the passage being formed in a lower portion of the airtight chamber which is held in a temperature zone equal to or lower than the melting point of a high-dissociation-pressure component.

Preferably, the furnace body comprises a cylindrical body and upper and lower lids for hermetically closing upper and lower openings of the cylindrical body, respectively, and the airtight chamber is attached to the lower lid removably mounted on the cylindrical body from below. The airtight chamber may be of a disassemblable construction.

It is possible that the apparatus further comprises a lifting rod which is vertically movable in the airtight chamber, the source material container being supported by an upper portion of the lifting rod.

It is preferable that the apparatus further comprise a reservoir for containing the high-dissociation-pressure component of the source material which is disposed in the airtight chamber at a height positioned between a region in which the source material container is disposed and the pressure equalizing passage and a vapor-flow control means for preventing vapor of the high-dissociation-pressure component evaporated from the reservoir from flowing downward, the vapor-flow control means being disposed between the reservoir and the pressure equalizing passage.

It is also preferable to further provide, in the airtight chamber, an airtight container for containing the source material container, the airtight container being provided with an open/close valve means which opens and closes depending on a pressure difference between the inside and outside of the airtight container to form a gas flow path. In this case, the open/close valve means may be provided with a liquid sealing agent which is for closing a communicating passage for providing communication between the inside and outside of the airtight container and is capable of forming the gas flow path in response to a variation in liquid level corresponding to the pressure difference between the inside and outside of the airtight container. Alternatively, the open/close valve means may comprise: a first check valve which opens when the pressure in the airtight container becomes higher than the pressure outside thereof; and a second check valve which opens when the pressure in the airtight pressure becomes lower than the pressure outside thereof.

Preferably, the airtight container is internally provided with a reservoir for containing the high-dissociation-pressure component. It is also preferable to provide the airtight container with a temperature measuring part for accommodating a temperature measuring means for measuring the temperature of a region of the source material container in which a seed crystal is inserted.

According to the present invention, the ambient atmosphere around the source material container is held by the airtight chamber at the equilibrium vapor pressure of the high-dissociation-pressure component. Consequently, a variation in the composition of the source material melt in the source material container is minimized, resulting in the preparation of a high-quality compound single crystal with little composition variation. Moreover, since the airtight chamber is formed with the pressure equalizing passage, no pressure difference is produced between the inside and outside of the airtight chamber even when the high-dissociation-pressure component is evaporated in the airtight chamber, thereby avoiding damage to the airtight chamber.

Further, although diffused vapor of the high-dissociation-pressure component forms a flow moving toward the pressure equalizing passage formed in a lower portion of the airtight chamber, the downwardly flowing vapor of the high-dissociation-pressure component is precipitated in droplets or in solids in a region around the above pressure equalizing passage, since the pressure equalizing passage is provided in the lower portion which is held at a low temperature equal to or lower than the melting point of the high-dissociation-pressure component. Accordingly, the vapor is seldom allowed to flow out of the airtight chamber. As a result, the internal structure of the furnace, such as the heating means, existing outside the airtight chamber is prevented from being contaminated. This reduces maintenance operations or the like required to remove the contamination, resulting in improved productivity.

DESCRIPTION OF THE PREFERRED EMBODIMENTS

Embodiment 1

Figure 1:
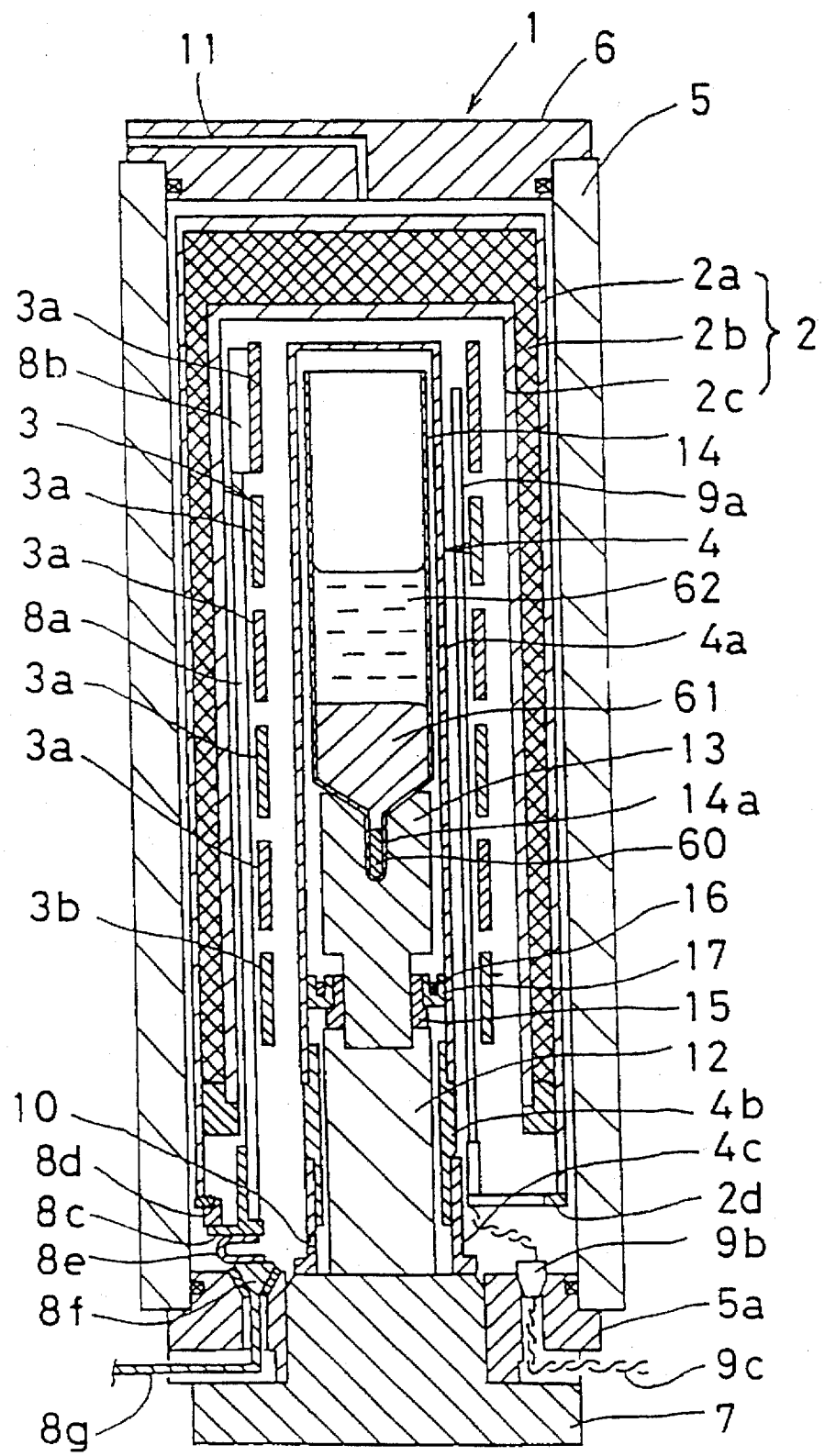
FIG. 1 is a vertical sectional view of an apparatus for preparing compound single crystals in Embodiment 1.

FIG. 1 shows an apparatus for preparing compound single crystals according to the present embodiment. The apparatus is so constructed as to prepare single crystals in accordance with vertical gradient freeze (VGF) solidifying method and comprises: a high-pressure container 1 as a furnace body of pressure-resistant structure; a heat insulating structure 2 disposed in the high-pressure container 1; a heater assembly 3 disposed inside the heat insulating structure 2; and an airtight chamber 4 disposed inside the heater assembly 3. As will be described later, the airtight chamber is adapted to control a gaseous atmosphere provided in a region in which a crucible 14 as a source material container installed inside is present.

The high-pressure container 1 includes: a cylindrical body 5; and upper and lower lids 6 and 7 removably fitted into upper and lower openings, respectively, of the cylindrical body 5, with respective seal rings interposed therebetween. Into the lower opening of the cylindrical body 5 is fitted a bottom ring member 5a. The lower lid 7 is removably fitted so as to cover up the central opening of the bottom ring member 5a. The high-pressure container 1 is accommodated in a frame (not shown) for sustaining vertical external forces from the upper and lower lids 6 and 7.

The heat insulating structure 2 disposed inside the high-pressure container 1 is formed into a cylinder closed at its top. The heat insulating structure 2 includes, from the outermost to the innermost, an outer cylinder 2a made of metal, an intermediate layer 2b made of a heat insulating material such as carbon felt or oxide-based ceramic fiber; and an inner cylinder 2c made of graphite. To the lower end of the external cylinder 2a is secured a fixed ring 2d, which is positioned above the foregoing bottom ring member 5a via a supporting member not shown. The heat insulating structure 2 is required to efficiently suppress excessive heat radiation resulting from an upward flow of a high-temperature gas generated during the operation in a high-pressure gaseous atmosphere. To satisfy the requirement, the heat insulating structure 2 is desirably provided with a highly hermetic layer formed from metal or like material. In the present embodiment, the outer cylinder 2a functions as the highly hermetic layer.

The highly hermetic layer is preferably disposed in the innermost position, where excellent heat resistance is required as well. If these requirements are taken into consideration, usable materials are limited to glassy carbon and metals with high melting points such as tungsten. However, since these materials are extremely expensive and substantially unavailable in terms of satisfying size requirements, the inner cylinder 2c is formed from a graphite material in the present embodiment. Since typical graphite is porous with a porosity of 10% to 20%, it is desirable for such graphite to be previously sealed by coating with pyrolytic graphite.

In the present embodiment, the heater assembly 3 placed inside the insulating structure 2 is composed of cylindrical heater elements 3a and 3b vertically arranged in six stages. Each of the heater elements 3a and 3b is connected to and supported by a lead electrode 8a through a connecting member 8b and supplied with electric power, the lead electrode 8a being disposed upright and outside the outer periphery of the heater assembly 3. The lower end of each lead electrode 8a is provided with a metal electrode 8c, which is supported by the fixed ring 2d via an insulating glass 8d. The bottom face of the metal electrode 8c is connected to a lead-through 8f of a heater power source via a flexible power-supply strip 8e. The lead-through 8f is attached, with its top portion exposed, to the bottom ring member 5a via an insulating member and connected to an external power source unit via a bus bar 8g.

Between the heater assembly 3 and the airtight chamber 4 are provided temperature detectors 9a for detecting the temperatures of the heater elements 3a and 3b in the individual stages, each detector 9a being positioned corresponding to each stage. Each of the temperature detectors 9a includes a thermocouple, a insulating tube containing and holding the two strands of the thermocouple in respective minute bores such that the two strands are kept away from each other, and a protective tube accommodating and holding the thermocouple and insulating tubes. The protective tube has its lower end supported by the fixed ring 2d. The temperature detectors 9a are each connected to a temperature control unit outside the apparatus via a temperature measurement lead-through 9b attached to the bottom ring member 5a and a temperature measurement lead wire 9c.

As materials for use in the heater elements 3a and 3b, carbon-based materials such as graphite and C/C composite are advantageous because they allow for easy working and for easy adjustment of the resistance of the heater elements. It is also possible to alternatively use silicon carbide and metal resistor materials with high melting points such as molybdenum and tungsten, depending on the temperature zone in which they are to be used. On the other hand, any material that has a low electric resistance value and will be neither softened nor deformed in a high-temperature atmosphere can be used for the lead electrode 8a and connecting member 8b. Examples of preferred materials include graphite.

The airtight chamber 4 is in the form of an inverted cup and is made entirely of a material impervious to gas. In the present embodiment, the airtight chamber 4 comprises three parts which are: a high-temperature part 4a composed of a cylinder closed at its top; a cylindrical intermediate part 4b; and a lower fixed part 4c secured to the lower lid 7. The individual parts are disassemblably and hermetically joined by fitting via an appropriate heat-insulating sealant. The high-temperature part 4a has heat resistance as well as airtightness and is formed from a material which will not contaminate a source material in a crucible 14 described later. To prepare a single crystal, it is required to heat the source material in the crucible 14 to a temperature equal to or higher than its melting point, thereby forming a melt. With ZnSe and ZnS, for example, it is required to heat the former compound to 1520° C. or higher and the latter compound to 1830° C. or higher, respectively. Where the high-temperature part 4a is heated to 1500° C. or higher, examples of suitable materials for such high-temperature part 4a include PBN, pyrolytic graphite, glassy carbon, graphite hermetically coated with pyrolytic graphite, and high-melting-point metals such as molybdenum and tantalum and alloys thereof. Where the airtight chamber 4 is formed from a weldable material, the airtight chamber 4 may be formed integrally by welding.

A side portion of the lower fixed part 4c of the airtight chamber 4 defines a pressure equalizing passage 10 for equalizing the internal and external pressures of the chamber. The pressure equalizing passage 10 may be a minute hole as shown in the drawing or a small clearance formed between the lower fixed part 4c and the top face of the lower lid 7. On the other hand, the upper lid 6 defines a gas supply/exhaust passage 11 through which an inert gas, such as an argon gas, under pressure is introduced into and exhausted from the high-pressure container 1. When introduced into the high-pressure container 1 through the gas supply/exhaust passage 11, the inert gas is also allowed to flow into the airtight chamber 4 through the pressure equalizing passage 10, so that the entire high-pressure container 1 is internally held at a uniform pressure.

In the airtight chamber 4, a pedestal 12 with a recessed portion formed in the upper end thereof is placed on the lower lid 7. In the recessed portion is fitted and held a crucible support 13 on which is disposed a crucible 14 made of PBN and having an inner diameter of 1 inch. The lower end of the crucible 14 is formed into a thin tube 14a having an inner diameter of 3 mm. In the drawing, a reference numeral 60 designates a seed crystal placed in the fine tube 14a, 61 designates a single crystal under growth, and 62 designates a source material melt.

To the periphery of the top of the pedestal 12 is attached a semi-sealing member 15 presenting an L-shaped cross section and constituting a vapor flow control means. On the outer circumferential surface of the above semi-sealing member 15 fitted around a lower portion of the crucible support 13 is mounted a ring-shaped reservoir 17 containing the high-dissociation-pressure component 16 of a source material compound, for example, Zn if the compound is ZnSe. The outer periphery of the reservoir 17 is substantially airtightly fitted into the inner periphery of a lower portion of the high-temperature part 5a of the airtight chamber 4. The semi-sealing member 15 has communicating pores, such as micropores or indiscrete pores, formed therein through which the inert gas for pressurization flows.

In the embodiment shown in the drawing, the heater elements 3a in the upper five stages of the heater assembly 3 form a heating means for heating the crucible 14, while the heater element 3b in the lowermost stage thereof forms a subordinate heating means for heating the reservoir. The heater element 3b in the lowermost stage and the corresponding temperature detector 9a cooperatively control the heating temperature for the high-dissociation-pressure component 16 in the reservoir 17 and cause a vapor pressure in equilibrium with the dissociation pressure of the high-dissociation-pressure component of the source material compound in the crucible 14 in the high temperature zone, thereby preventing the composition of the source material in the crucible 14 from varying, as will be described later. As will also be described later, the heater element 3b in the lowermost stage and temperature detector 9a as the subordinate heating means may be disposed in the airtight chamber 4, separately from the other heater elements 3a.

Next, a description will be given to specific operational procedures for preparing a ZnSe single crystal using the apparatus thus constructed and an example of the resultant single crystal.

Initially, seed crystal 60 having a diameter of 2.5 mm and a length of 35 mm, which had been cut out of ZnSe produced by vapor phase growth, was placed in the thin tube 14a of the crucible 14, followed by the charging of about 200 g of polycrystalline ZnSe of 6N (nine) grade as the source material. On the other hand, 12 g of Zn as the high-dissociation-pressure component 16 was charged into the reservoir 17 of the apparatus shown in FIG. 1. The crucible 14 was placed on the crucible support 13 and then the cylindrical high-temperature part 4a of the airtight chamber 4 was attached in position. The lower lid was then attached to the bottom ring member 5a, thereby hermetically sealing the high-pressure container 1.

After completing the above preparatory operations, the high-pressure container 1 was evacuated through the gas supply/exhaust passage 11, followed by two replacing operations of sequentially charging and discharging an argon gas at 10 kgf/cm². Subsequently, the argon gas was charged to achieve a pressure equal to or higher than 3 kgf/cm². In the present embodiment, 10 kgf/cm² was achieved. After that, the heater elements 3a in the respective stages were energized, thereby forming a vertical temperature distribution as indicated by C1 in FIG. 2. Specifically, the heater elements 3a in the respective stages of the heater assembly 3 were controlled so that the temperature of the thin tube 14a of the crucible 14 would be precisely 1520° C., which was the solidifying point of ZnSe, and that the temperature in the portion of the crucible above the thin tube 14a would be higher than 1520° C. (1550° C. in the present embodiment), thereby melting the source material and initiating the crystal growth from the seed crystal. At the time when 1000° C. was reached in the temperature raising process, argon gas was introduced to achieve 50 kgf/cm² and was eventually held at 50 kgf/cm².

Since the dissociation pressure for Zn of ZnSe, which corresponds to the heating temperature for the molten ZnSe (1550° C. in the present embodiment), was about 2.5 kgf/cm², the reservoir 17 was heated to 1000° C. by means of the heater element 3b in the lowermost stage so as to generate a vapor of Zn at a pressure corresponding to the dissociation pressure.

Subsequently, the power fed to the heater elements 3a in the individual stages was controlled so that the position of the solidifying point 1520° C. would shift upward at a rate of about 3 mm/hour, thereby gradually solidifying the source material melt 62 from its portion in contact with the seed crystal 60 and growing the single crystal 61. The temperature distribution in the process of growing the single crystal is indicated by C2 in FIG. 2. Since a ZnSe crystal has the wurtzite structure at a temperature equal to or higher than 1425° C. and has the intended zinc blende structure at a temperature equal to or lower than 1425° C., the temperature gradient in the vicinity of the solidifying point is made steep in the temperature distribution shown in the drawing to obtain a single crystal of zinc blende structure at a stroke by utilizing the supercooling phenomenon of the melt. If a solidified single crystal is subjected to a large temperature gradient, it is likely that a transformation, which may be turned into a defect by a thermal stress, as well as a variation in composition will result, the temperature in the single crystal region was held at 1400° C. immediately below the solidifying point, thereby preventing these defects.

Figure 2:
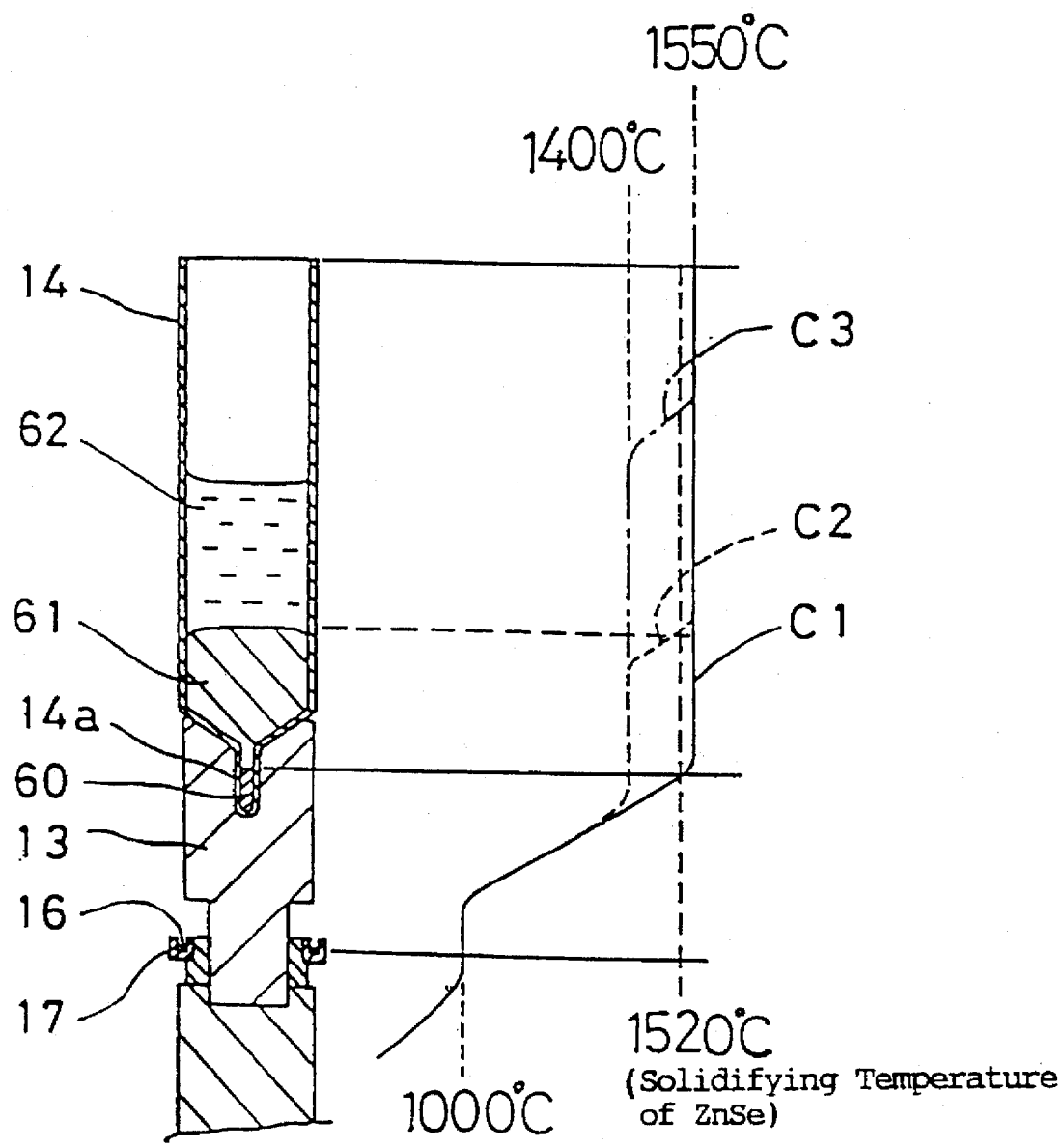
FIG. 2 is an explanatory view for illustrating a temperature distribution formed by a heater assembly in the above apparatus and a transition of the distribution with a growing single crystal.

Thereafter, the operation of growing the single crystal was stopped at the time when the solidification of the whole source material melt 62 was completed, i.e., when the temperature distribution matched the temperature distribution indicated by C3 of FIG. 2. Subsequently, the power supplied to the individual heater elements 3a was gradually decreased, while confining a temperature variation in the region of the crucible 14 within the range of ±30° C. so as not to form a comparatively large temperature gradient in the vertical direction of the single crystal, thereby evenly reducing the temperature in the furnace. In this case, the temperature of the reservoir 17 was held at 1000° C. till the temperature of the crucible 14 reached 1200° C. and cooling was performed thereafter while constantly keeping the crucible 14 at a temperature higher than the temperature of the reservoir 17.

After cooling, the argon gas was released and recovered to achieve the atmospheric pressure. Then, by moving the lower lid 7 downward, the whole airtight chamber 4 was pulled down to a position below the bottom ring member 5a. Finally, there was recovered the crucible 14 containing the single crystal 61 formed therein by dismounting the whole airtight chamber 4 or the high-temperature part 4a.

On the inner surface of the air-tight chamber 4 were deposited droplets of Zn which were localized in the vicinity of the reservoir 17, while the other portions remained uncontaminated. The ZnSe removed from the crucible 14 was a high-quality single crystal in clear yellow, with a part corresponding to about ⅔ the length from its bottom being free from a twin crystal.

In the present embodiment described above, the source material contained in the crucible 14 was melted by heating in the high-pressure gaseous atmosphere through the airtight chamber 4 with the use of the heater assembly 3 disposed around the outer periphery of the airtight chamber 4, thereby growing the single crystal 61 from the source material melt 62. Since the ambient atmosphere around the crucible 14 was held at the equilibrium vapor pressure of the high-dissociation-pressure component by means of the airtight chamber 4 during the single crystal growing operation, a composition variation is minimized and hence compound single crystals of excellent quality can be prepared. Since the airtight chamber 4 defines the pressure equalizing passage 10, an excessively large pressure difference is not formed between the inside and outside of the airtight chamber 4 during the operation of replacing the atmosphere with the inert gas at an early stage and in the case where the pressure increases as a result of evaporation of the high-dissociation-pressure component in the airtight chamber 4, thereby preventing damage to the airtight chamber 4.

Moreover, even if the vapor of the high-dissociation-pressure component forms a diffusion flow moving toward the pressure equalizing passage 10 positioned in a lower portion of the airtight chamber 4, the pressure equalizing passage 10 is situated in a region which is held at a low temperature equal to or lower than the solidifying point of the high-dissociation-pressure component and hence, the vapor of the high-dissociation-pressure component flowing downward is precipitated in droplets or in solids in a region around the pressure equalizing passage 10. As a result, the vapor are seldom allowed to flow out of the airtight chamber 4. Consequently, the contamination of the structure such as the heater assembly 3 outside the airtight chamber 4 in the furnace is prevented and, therefore, the maintenance operations required to remove the contamination can be reduced, resulting in improved productivity and constant production of compound single crystals of high quality.

Furthermore, single crystals are grown in the above apparatus with the high-pressure container 1 filled with the inert gas. The pressure of the inert gas is set to a value equal to or higher than the dissociation pressure of the high-dissociation-pressure component of the compound source material at the heating temperature for the source material melt 62. With the setting of the pressure, the vapor of the high-dissociation-pressure component merely moves diffusively in the airtight chamber 4, so that the vapor is less likely to flow out of the airtight chamber 4.

Further, the airtight chamber 4 of the apparatus is internally provided with the reservoir 17 containing the high-dissociation-pressure component 16. In growing a single crystal, the reservoir 17 is also heated to produce vapor of Zn at a pressure in equilibrium with the dissociation pressure of molten ZnSe corresponding to the heating temperature. This is because, in growing a single crystal of ZnSe or other compounds belonging to group II–VI such as CdTe and ZnS or to group III–V such as InP, GaP and GaAs, the pressure of one component of the compound is higher, so that the high-dissociation-pressure component is evaporated from the melt when it is heated to a high temperature equal to or higher than the solidifying point, resulting in a variation in the composition of the compound source material. According to the present embodiment, the variation in the composition of the source material can be prevented, since the reservoir 17 is heated to produce a vapor pressure in equilibrium with vapor pressure of the high-dissociation-pressure component evaporated from the source material melt 62 in the high temperature zone.

In the above apparatus, since the semi-sealing member 15 for filling up the clearance between the inner circumferential surface of the reservoir 17 and the crucible support 13 is provided as a vapor-flow preventing means, vapor of the high-dissociation-pressure component 16 generated from the reservoir 17 can substantially be prevented from flowing downward to a position below the semi-sealing member 15 by setting the heating temperature of the heater element 3b in the lowermost stage to a point lower than the heating temperatures of the other heater elements 3a, i.e., by setting the temperature of the region in which the reservoir 17 is present to the lowest within the inner space of the airtight chamber 4 to be filled with the vapor of the high-dissociation-pressure component 16. Moreover, the precipitation resulting from condensation of vapor of the high-dissociation-pressure component 16 can be prevented in the other portions above the reservoir 17, thereby increasing the efficiency with which the component for evaporation contained in the reservoir 17 is used as well as facilitating the recovery of the vaporized component after use, resulting in improved productivity.

If the temperature of the semi-sealing member 15 is lowered, the above function cannot effectively be implemented. The semi-sealing member 15 is preferably formed from a material, such as graphite, having a heat insulating property and communication pores for pressure equalization. In the present embodiment, vapor flowing downward in the case where the semi-sealing member 15 is not provided or a small amount of vapors flowing downward through the semi-sealing member 15 moves toward the pressure equalizing passage 10 formed in the lower fixed portion 4c of the airtight chamber 4. However, since such vapors are cooled and precipitated in the course of flowing toward that region, there is no risk of their condensation or deposition on the heater elements 3a and 3b. This eliminates the necessity of forming the pressure equalizing passage into a complicated labyrinthine structure or the like, since it is sufficient for the pressure equalizing passage to permit only the inert gas for pressurization to flow therethrough. As a result, the pressure equalizing passage may be formed into a simple structure that withstands repeated use.

In heating and evaporating the high-dissociation-pressure component 16, a variation in the composition of the single crystal 61 which would otherwise be caused in the process of cooling the high-temperature-zone can be prevented as in the above embodiment by continuing to heat and evaporate the high-dissociation-pressure component 16 even after the whole source material melt 62 in the crucible 14 is solidified and crystallized and thereby generating a vapor pressure equal to or higher than the dissociation pressure of the high-dissociation-pressure component of the resulting crystal during the cooling operation. In this manner, compound single crystals of higher quality can be prepared. In this case, it is sufficient to heat the high-temperature component 16 to a temperature range below the melting point of the component.

By constructing the high-pressure container 1 including the cylindrical body 5 and the upper and lower lids 6 and 7 for closing the upper and lower openings thereof and by additionally providing the airtight chamber 4 on the lower lid 7 detachable from the cylindrical body 5 from below, the airtight chamber 4 can be readily dismounted from the high-pressure container 1 together with the lower lid 7, which facilitates the dismounting of the crucible 14 from the airtight chamber 4. Moreover, the mounting of the airtight chamber 4 in the high-pressure container 1 can also be performed easily. Furthermore, with the disassemblable construction of the airtight chamber 4, the mounting and dismounting of the crucible 14 in and from the airtight chamber 4 can also be performed easily, thereby improving productivity.

Embodiment 2

Below, a description will be given to another embodiment of the present invention with reference to FIG. 3. For the convenience of description, the members having the same function as those of the members shown in the above Embodiment 1 are designated by the same reference numerals so as to omit the description thereof. The same shall apply to the other embodiments which will be described later.

Figure 3:
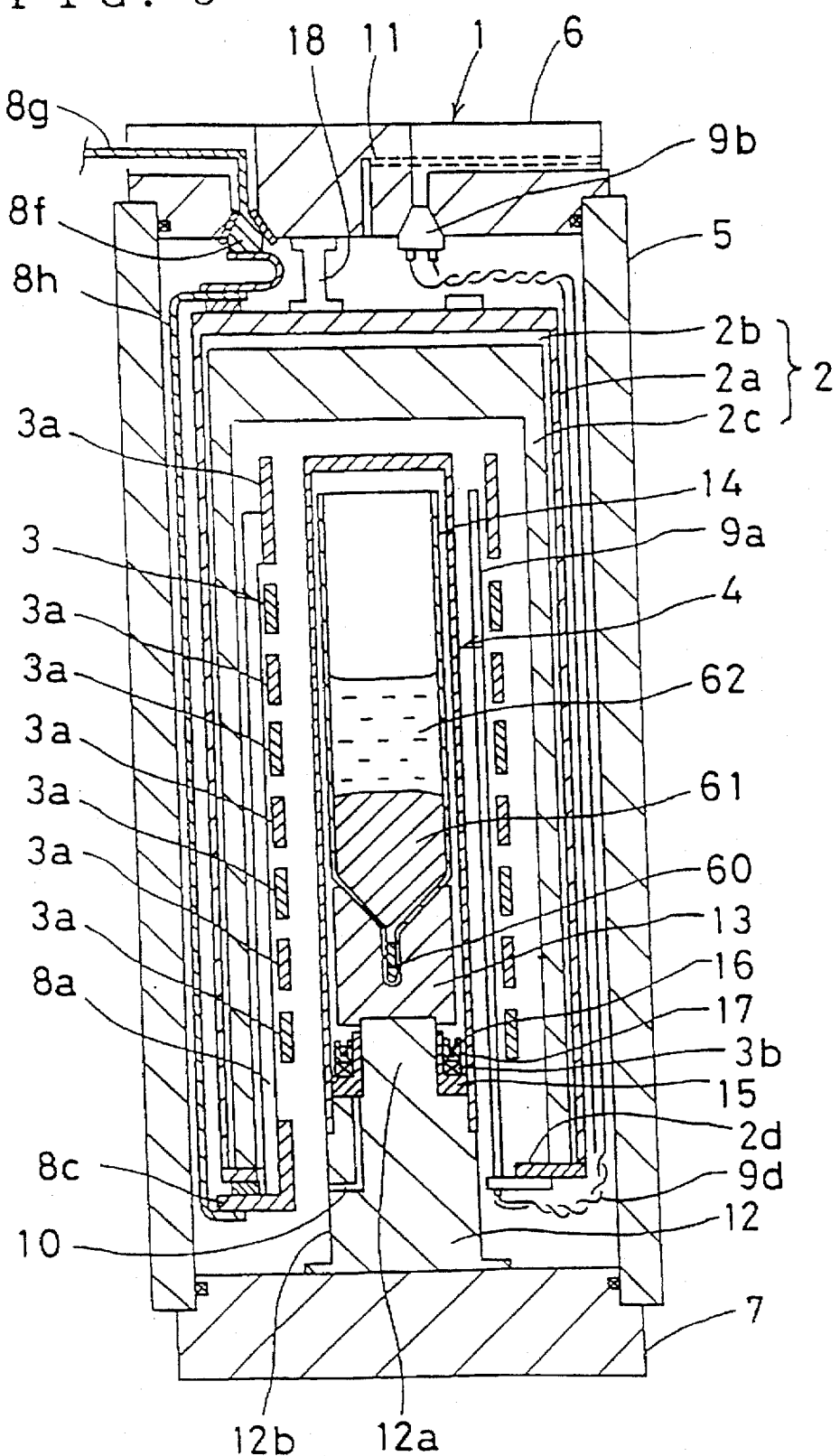
FIG. 3 is a vertical sectional view of an apparatus for preparing compound single crystals in Embodiment 2.

As shown in FIG. 3, heat insulating structure 2 in an apparatus for preparing single crystals according to the present embodiment is suspended by upper lid 6 via a suspending member 18. Fixed ring 2d attached to the lower end of the insulating structure 2 supports the heater elements 3a of the heater assembly and the temperature detectors 9a. The upper lid 6 is provided with a lead-through 8f for heater power source and a lead-through 9b for temperature measurement which are connected to the heater elements 3a and temperature detectors 9a via a heater lead wire 8h and a lead wire 9d for inner temperature measurement.

An inner cylinder 2c of the above heat insulating structure 2 is formed from, e.g., a carbon-based molded product obtained by molding carbon fibers together with an organic binder and then carbonizing the binder. This is because, of the properties of the inner cylinder 2c, the heat insulating property is considered more important than the airtightness in this embodiment. Intermediate layer 2b is composed of a hollow layer which is not filled with a heat insulating material.

On a smaller diameter portion 12a forming an upper part of the pedestal 12 which is placed on the lower lid 7 of the high-pressure container 1 is mounted the crucible support 13. To the outer periphery of the upper end of a larger diameter portion 12b forming a lower part of the pedestal 12 is removably attached the airtight chamber 4 composed only of a structure equivalent to the high-temperature part 4a in the former embodiment. On the stepped portion of the pedestal 12, which is defined between the smaller diameter portion 12a and the larger diameter portion 12b of the pedestal 12, is disposed the semi-sealing member 15 presenting an L-shaped cross section. The outer periphery of a lower portion of the semi-sealing member 15 is fitted into the inner periphery of the airtight chamber 4. On the top face of the lower portion of the semi-sealing member 15 is disposed the ring-shaped heater element 3b for heating a reservoir 17 disposed thereon.

As has been described, the semi-sealing member 15 is formed from a heat insulating material having a sealing property which will not disturb the state of equalized pressure. In the present embodiment, however, the pressure equalizing passage 10 for providing communication between the inside and outside of the airtight chamber 4 is provided in the pedestal 12, with its opening bored in the above stepped portion of the pedestal 12. Into the smaller diameter portion 12a of the pedestal 12 is inserted a temperature detector (not shown) adjacent the reservoir heating heater element 3b so as to detect the temperature thereof. With such an arrangement, the temperature of the reservoir 17 can be controlled with higher precision.

Next, a description will be given to specific operational procedures in preparing GaAs single crystals using the apparatus thus constructed and to an example of the result.

The crucible 14 in the present embodiment was made of PBN and had an inner diameter of 3 inches. A GaAs seed crystal having a diameter of 4 mm and a length of 40 mm was positioned in the fine tube 14a of the crucible 14, followed by the charging of about 700 g of GaAs polycrystalline material of 6N grade. On the other hand, the reservoir 17 was charged with about 8 g of As as the high-dissociation-pressure component 16. Thereafter, the crucible 14 was set in the high-pressure container 1 as shown in FIG. 3, which was then hermetically sealed.

Subsequently, the high-pressure container 1 was evacuated, followed by the gas replacing operation with an argon gas at 10 kgf/cm². Thereafter, argon gas was filled at 5 kgf/cm² and the heater elements 3a and 3b in the respective stages were energized to initiate the temperature raising process. The temperature around the center of the seed crystal 60 was set to 1238° C., which is the solidifying point of GaAs and a region upper than the central portion of the seed crystal was set to 1270° C. so as to melt the source material in the crucible 14, while the temperature of the reservoir 17 was set to 610° C. so as to form a temperature distribution as same as that indicated by C1 in FIG. 2. After that, the position of the solidifying point was shifted upward at a rate of about 5 mm/hour. At the time when a temperature distribution as same as that indicated by C3 in FIG. 2 was implemented, the overall temperature was lowered.

After the temperature lowering or cooling process, the argon gas was released and recovered to achieve the atmospheric pressure. Then, the lower lid 7 was pulled down to dismount the crucible 14 from the airtight chamber 4. Although powdery As was observed as deposited on an inner surface of the airtight chamber 4 in the vicinity of the reservoir 17, the other regions remained uncontaminated. A plate-like sample was cut out of the GaAs single crystal removed from the crucible 14 and polished and etched in order to evaluate its transformation density in terms of etch pit density (EPD). The result was as significantly low as about 1000/cm², which confirmed that the obtained single crystal had high quality.

Embodiment 3

Figure 4:
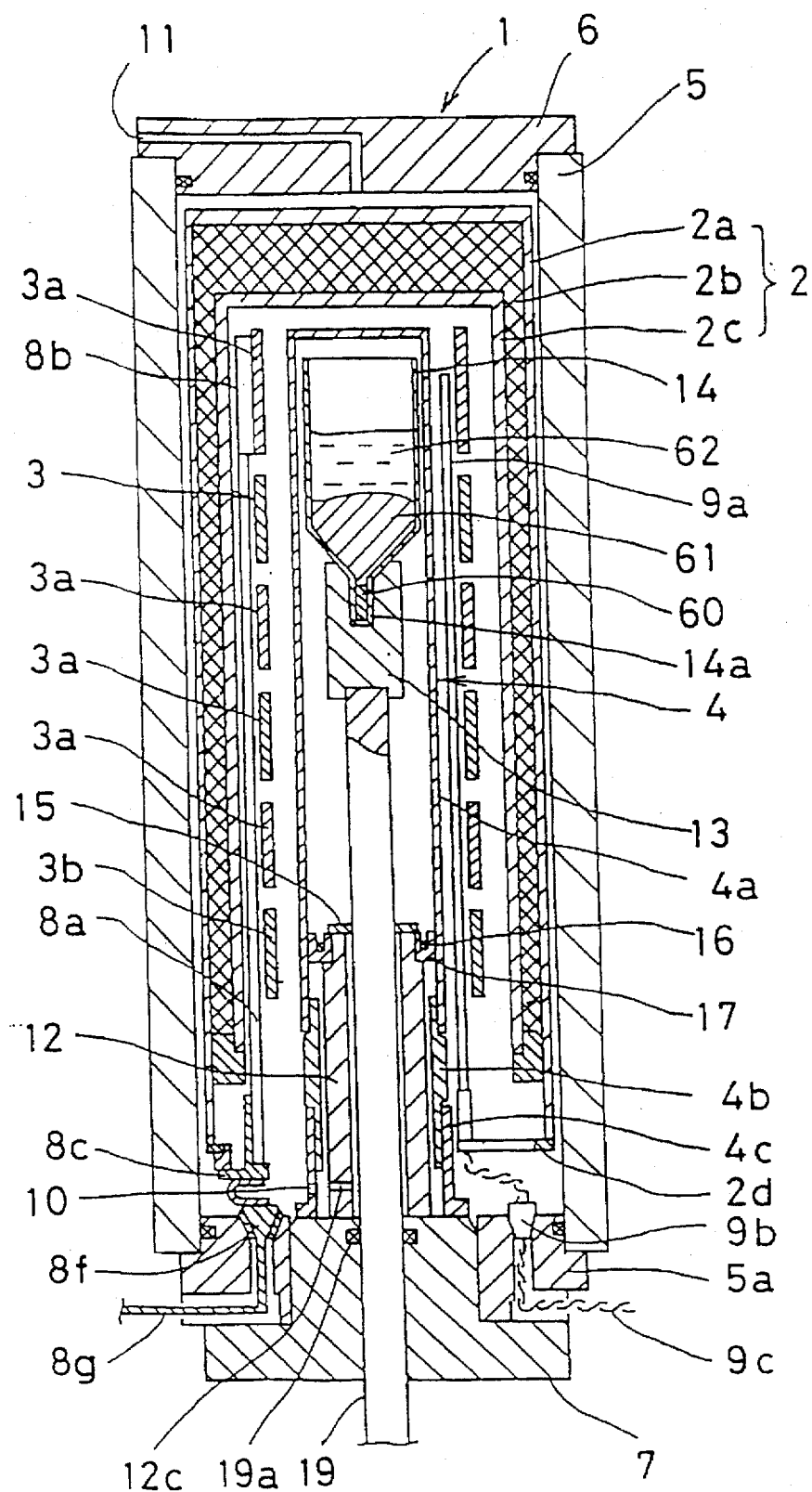
FIG. 4 is a vertical sectional view of an apparatus for preparing compound single crystals in Embodiments 3 and 4.

Below, a description will be given to still another embodiment of the present invention with reference to FIG. 4.

The drawing shows an example of an apparatus for preparing single crystals in accordance with the vertical Bridgman (VB) method. In the apparatus, the crucible support 13 for supporting the crucible 14 is mounted on the upper end of a lifting rod 19 vertically extending through the lower lid 7. The lifting rod 19, which provides hermetic seal with a seal ring 19a and is slidable in the vertical direction, is moved upward and downward by a lifting drive unit (not shown).

The pedestal 12 placed on the lower lid 7 in the airtight chamber 4 is formed with a central bore for permitting the insertion and free movement of the above lifting rod 19. To the top surface of the pedestal 12 is attached the reservoir 17. The outer periphery of the reservoir 17 is fitted in the inner periphery of a lower portion of the high-temperature part 4a of the airtight chamber 4 in a substantially hermetical manner. The semi-sealing member 15 is configured conformable with the inner upper periphery of the reservoir 17 and the top surface of the pedestal 12 around the outer periphery of the lifting rod 19.

Similarly to the foregoing individual embodiments, the semi-sealing member 15 has the function of preventing vapor of the high-dissociation-pressure 16 generated from the reservoir 17 from flowing downward as well as a pressure equalizing function. In the present embodiment the semi-sealing member 15 comprises a ring-shaped layered structure composed of a graphite sheet. The lower end portion of the pedestal 12 is formed with a communicating passage 12c in the form of a minute hole for pressure equalization which extends from an outer circumferential surface of the pedestal 12 to the central bore extending in the vertical direction.

Next, a description will be given to specific operational procedures in preparing ZnSe single crystals using the apparatus thus constructed and to an example of the result.

Initially, seed crystal 60 having a diameter of 2.5 mm and a length of 35 mm cut out of ZnSe produced by vapor phase growth was placed in the thin tube 14a of the crucible 14 made of PBN and having an inner diameter of 1 inch, followed by the charging of about 180 g of ZnSe polycrystalline material of 6N grade. On the other hand, the reservoir 17 was charged with 10 g of Zn. After that, the crucible 14 was placed on the crucible support 13 disposed on the upper end of the lifting rod 19 and the glassy-carbon-made high-temperature part 4a of the airtight chamber was mounted. Subsequently, the lower lid 7 together with the lifting rod 19 was attached to the bottom ring member 5a from below, thereby hermetically sealing the high-pressure container 1.

After completing the preparatory operations, the high-pressure container 1 was evacuated and then two replacing operations of charging and discharging argon gas at 10 kgf/cm$^2$ were performed. Subsequently, argon gas was charged at 10 kgf/cm$^2$ and then the heater elements 3a and 3b were energized so as to raise the temperature to 1540° C. at a rate of 500° C./hour, thereby melting the source material. In this case, the lower 10 mm part of the seed crystal 60 reached 1520° C. and a temperature distribution decreasing with lowering position was formed, thereby initiating the single crystal growth from the seed crystal. In the process of raising temperature, the argon gas was introduced at the time when 1000° C. was reached to achieve 50 kgf/cm$^2$ and the pressure was eventually held at 100 kgf/cm$^2$.

After the growth from the seed was initiated, the lifting unit was driven to lower the crucible 14 together with the lifting rod 19 at a rate of 5 mm/hour. At the time when the upper end portion of the crucible 14 reached 1480° C., the whole apparatus was cooled at a rate of 200° C./hour. In this case, the electric power fed to the heater element 3b in the lowermost stage was controlled to achieve a Zn vapor pressure of 2.4 kgf/cm$^2$ till the temperature of the crucible 14 assumed 1200° C., with the temperature of the reservoir 17 being controlled to 1000° C. Thereafter, the cooling operation was performed while constantly keeping the crucible 14 at a temperature higher than that of the reservoir 17.

After cooling, the argon gas was released and recovered to achieve the atmospheric pressure and the lower lid 7 together with the lifting rod 19 was lowered out of the high-pressure container 1 to dismount the crucible 14 from the airtight chamber 4. Although Zn droplets were deposited on an inner surface of the airtight chamber 4 in the vicinity of the reservoir 17, the upper portion thereof remained uncontaminated. The ZnSe removed from the crucible 14 was a high-quality single crystal in clear yellow, with a part corresponding to about 70% of the length from its bottom being free from a twin crystal.

Thus, a single crystal is grown in accordance with the VB method by shifting the crucible 14 supported by the lifting rod 19 vertically moving in the airtight chamber 4. Since the temperature distribution formed in the inside of the airtight chamber 4 is more stable than the outside thereof, a single crystal of higher quality can be prepared.

Embodiment 4

The present embodiment used an apparatus of substantially the same structure as that of the apparatus (see FIG. 4) described in Embodiment 3 to prepare a GaAs single crystal.

In this case, a GaAs seed crystal having a diameter of 4 mm and a length of 10 mm was placed in the crucible 14 made of PBN and having an inner diameter of 3 inches, followed by the charging of about 700 g of GaAs polycrystalline material of 6N grade. On the other hand, the reservoir 17 was charged with about 5 g of As. After setting the crucible support 13 on the upper end of the lifting rod 19, the crucible 14 was placed thereon. Subsequently, the high-temperature part 4a, made of molybdenum, of the airtight chamber 4 was mounted and then the lower lid 7 together with the lifting rod 19 was fitted in the opening of the bottom ring member 5a, thereby hermetically sealing the high-pressure container 1.

After completing the above preparatory operations, the evacuation and the gas replacing operations were performed in the same manner as in Embodiment 3. Thereafter, argon gas at 5 kgf/cm$^2$ was filled into the high-pressure container 1 and the temperature was raised to 1250° C. at a rate of 400° C./hour, thereby melting the source material. In this case, a temperature gradient was formed such that the temperature at the center of the seed crystal 60 assumed 1238° C., or the solidifying point of GaAs, to initiate the growth from the seed crystal. At that time, a pressure of 11 kgf/cm$^2$ was achieved. Subsequently, the crucible 14 was lowered at a rate of 5 mm/hour. Meanwhile, the temperature of the reservoir 17 was kept at 610° C. to achieve an As vapor pressure of about 1 kgf/cm$^2$, till the temperature of the crucible 14 reached 800° C.

After cooling, the argon gas was released to achieve the atmospheric pressure in the apparatus and then the lower lid 7 together with the lifting rod 19 was pulled down to dismount the crucible 14 from the airtight chamber 4. Although solidified As was deposited on an inner surface of the airtight chamber 4 in the vicinity of the reservoir 17, the other portions remained uncontaminated. The GaAs single crystal removed from the crucible 14 presented a considerably low transformation density of about 1000/cm$^2$, which confirmed its high-quality.

Embodiment 5

Next, a description will be given to still another embodiment of the present invention with reference to FIGS. 5 and 6.

Figure 5:
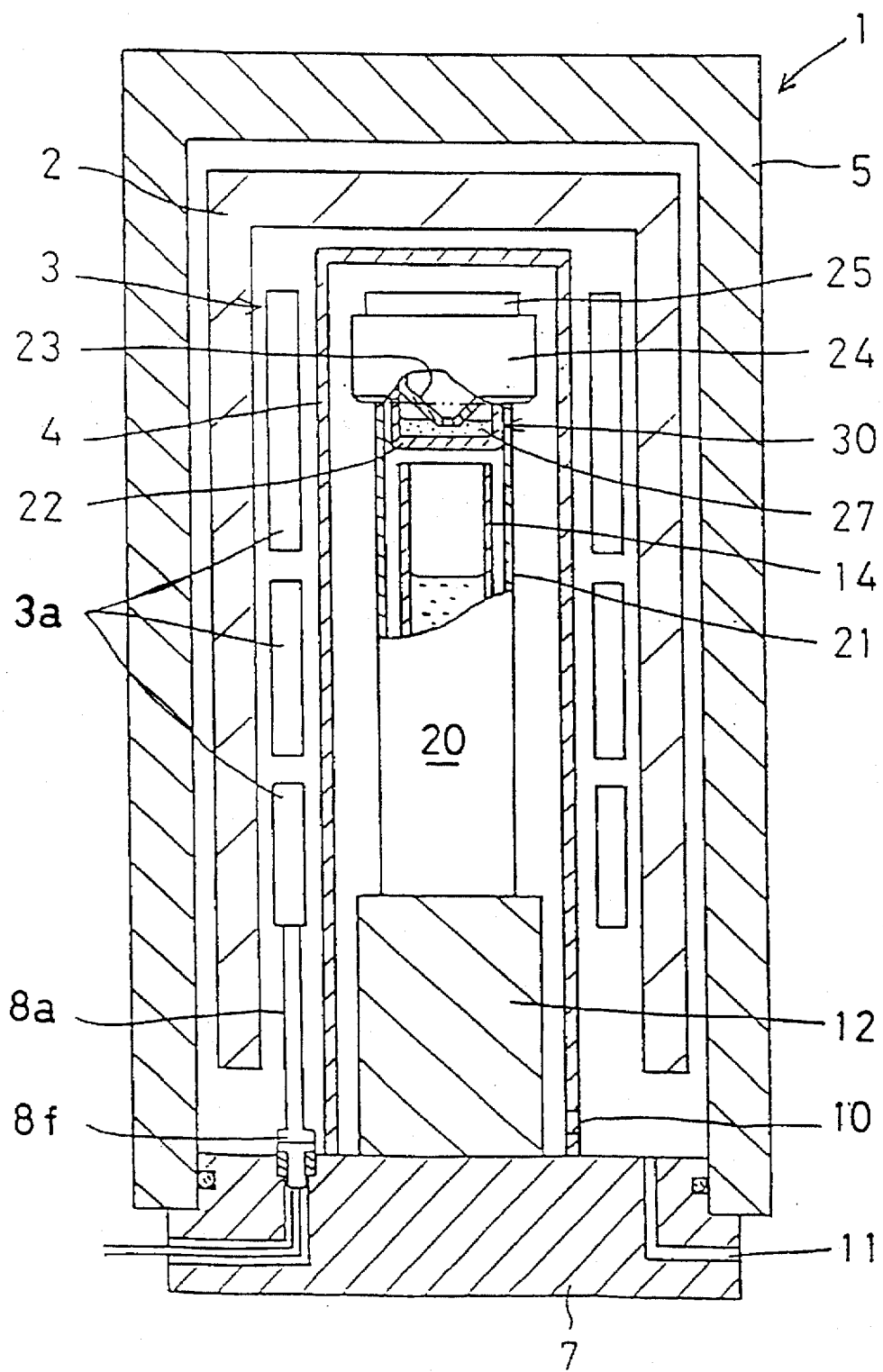
FIG. 5 is a vertical sectional view of an apparatus for preparing compound single crystals in Embodiment 5.

FIG. 5 shows an apparatus for preparing single crystals using the vertical gradient freeze (VGF) solidifying method according to the present embodiment. Similarly to the foregoing individual embodiments, the apparatus includes high-pressure container 1 as a furnace body of pressure-resistant structure in which there are heat insulating structure 2, heater assembly 3 disposed in the heat insulating structure 2, and airtight chamber 4 in the form of an inverted cup made of a material impervious to gas and disposed in the heater assembly 3. The cylindrical body 5 of the high-pressure container 1 is formed into a cylinder closed at its top. Lower lid fitted into the lower opening of the cylindrical body 5 is provided with the gas supply/exhaust passage 11.

In the present embodiment, an airtight container 20 containing the crucible 14 therein is placed on the pedestal 12 disposed in the airtight chamber 4 so that the whole airtight container 20 is heated by the heater assembly 3.

Figure 6:
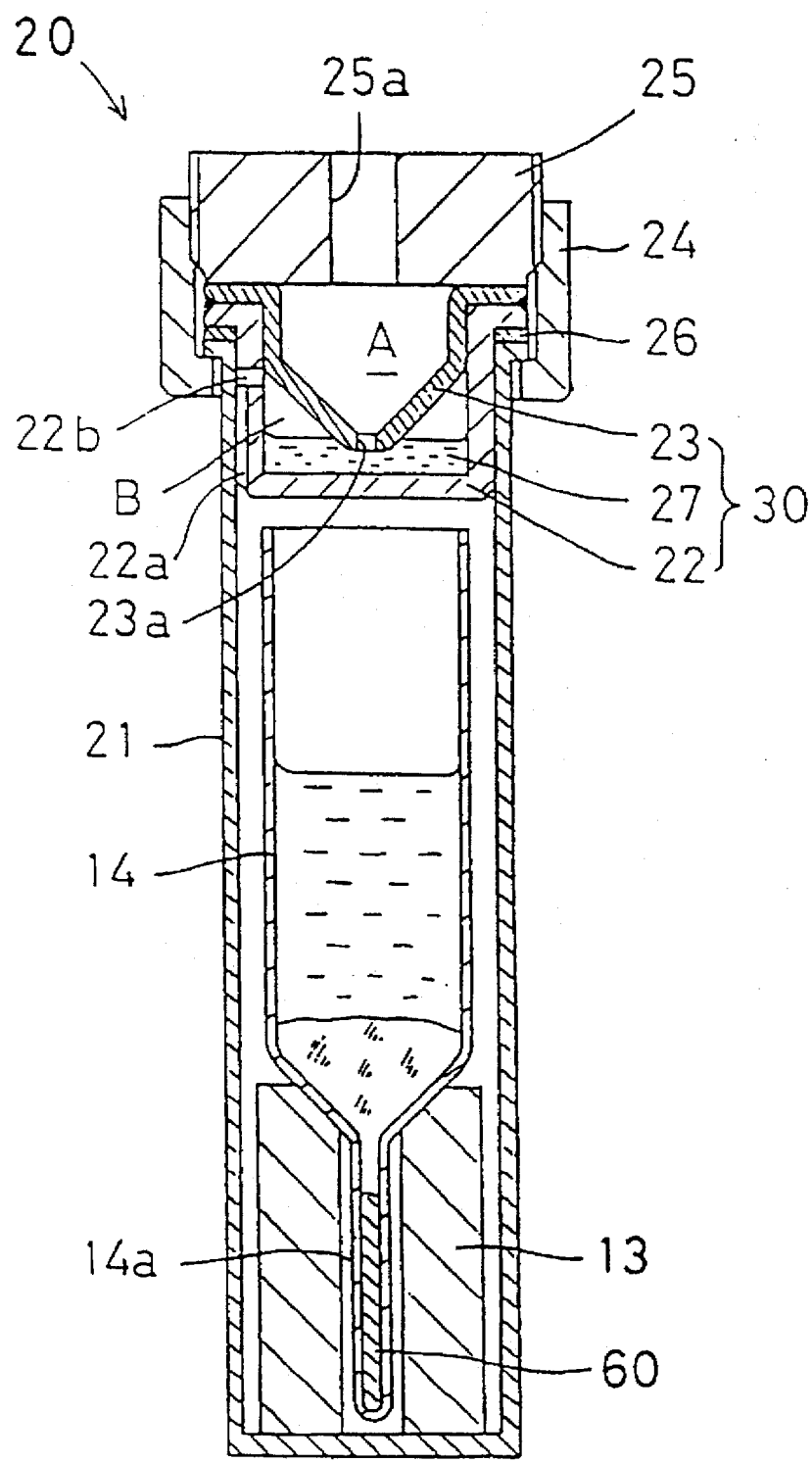
FIG. 6 is a vertical sectional view showing an airtight container set in the apparatus in Embodiment 5.

The airtight container 20 is made of a heat insulating material such as molybdenum and comprises, as shown in FIG. 6, a cylindrical main body 21 closed at its lower end, a sealing agent container 22 in the form of a cup which is fitted in the upper end of the main body 21 from above, and a conical member 23 in the form of an inverted cone which closes the sealing agent container 22 from above. The upper end of the main body 21, the sealing agent container 22 and the conical member 23 are fixed to each other with their peripheral flange portions joined in the axial direction by means of a fastening ring 24 into which the upper end of the main body 21 is fitted and of a screw cap 25 threadingly attached to a female thread portion formed in the inner circumferential face of the upper end of the fastening ring 24. The respective peripheral flange portions of the sealing agent container 22 and conical member 23 are hermetically joined together by welding. Between the respective flange portions of the sealing agent container 22 and the upper end of the main body 21 is interposed a seal ring 26 for keeping hermetical seal therebetween.

The conical member 23 divides the space in the sealing agent container 22 into upper and lower portions (hereinafter the upper and lower portions relative to the conical member 23 will be referred to as upper and lower spaces A and B, respectively). The center in the lowermost position of the conical member 23, which corresponds to the vertex of the inverted cone, is formed with a minute hole 23a for providing communication between the upper and lower spaces A and B.

On the other hand, the side wall of the sealing agent container 22 is formed to have an outer diameter which barely permits the sealing agent container 22 to be fitted into the main body 21. The circumferential surface of the sealing agent container 22 is formed with a vent channel 22a extending vertically and connecting to the lower space in the main body 21 relative to the sealing agent container 22. The sealing agent container 22 is also formed with a vent hole 22b at a location higher than the minute hole 23a, which extends through the sidewall of the sealing agent container 22 so as to provide communication between the upper end portion of the vent channel 22a and the lower space B of the sealing agent container 22. The screw cap 25 defines a central hole 25a which vertically extending through the screw cap 25 so as to provide communication between the upper space A and the outside of the airtight container 20.

The sealing agent container 22 is filled with a sealing agent 27 such as $B_2O_3$ in such an amount as to close the minute hole 23a of the conical member 23 when it is melted, as shown in the drawing, and not to overflow when the liquid level thereof fluctuates due to a pressure difference between the upper and lower spaces A and B.

In such an arrangement according to the present embodiment, the sealing agent container 22, the conical member 23 and the sealing agent 27 constitute an open/close valve means 30 which opens and closes a communicating path for providing communication between the inside and outside of the airtight container 20, i.e., starting from the vent channel 22a, passing through the vent hole 22b, lower space B, minute hole 23 and upper space A, and terminating in the central hole 25a.

In the airtight container 20, the crucible support 13 is disposed on the bottom wall of the main body 21. On the crucible support 13 is placed the crucible 14 which is supported upright thereby. The crucible 14 is composed of, e.g., p-BN and has an inner diameter of about 15 mm. The lower end of the crucible 14 is formed into a thin tube 14a for insertion of the seed crystal 60.

Below, a description will be given to the procedures in preparing a ZnSe single crystal using the present apparatus and to an example of the result.

Initially, rod-like ZnSe seed crystal 60 was inserted into the thin tube 14a of the crucible 14, followed by the charging of about 40 g of polycrystalline ZnSe in the form of a small mass prepared by CVD and available from Raytheon Co. into the crucible 14. After setting the crucible 14 in the main body 21 of the airtight container 20, the sealing agent container 22 charged with the sealing agent 27 composed of powdery $B_2O_3$ and the conical member 23 were fastened to the upper end of the main body 21 by means of the fastening ring 24 and screw cap Subsequently, the lower lid 7 of the high-pressure container 1 was opened to place the airtight container 20 on the pedestal 12 and then closed, thereby setting the airtight container 20 in the high-pressure container 1 as shown in FIG. 5. Thereafter, the high-pressure container 1 was evacuated through the gas supply/exhaust passage 11 and then an argon gas at 5 kgf/cm$^2$ was introduced into the high-pressure container 1, thereby replacing the inner atmosphere. In this process, since the sealing agent 27 in the sealing agent container 22 is in a powdery state, it does not present an excessively large resistance to the gas flow.

Subsequently, the argon gas at, for example 300 kgf/cm$^2$, was introduced and then heating power was fed to the heater assembly 3, thereby initiating heating. In the process of raising temperature, $B_2O_3$ as the sealing agent 27 was melted at a temperature of 450° C. and thereby closes the minute hole 23a in the conical member 23. The process of raising temperature was further continued to set the temperature of the upper part of the airtight container 20 to 1550° C., which was higher than the melting point 1526° C. of ZnSe, and set the temperature for the lower part thereof to 1515° C. so that the seed crystal 60 was not entirely melted down, thereby melting the entire amount of ZnSe source material. At that time, a pressure of 1200 kgf/$^2$ was achieved in the high-pressure container 1.

Thereafter, the temperature was lowered at a rate of 3.5° C./hour till the temperature of the upper part of the airtight container 20 assumed 1510° C., while keeping the above temperature gradient constant (for about 10 hours at a growth rate of about 5 mm/hour), thereby growing a ZnSe crystal from the bottom portion of the source material melt in contact with the seed crystal 60 in the upward direction. At the time when the whole melt was solidified and crystallized, the power fed to the heater assembly 3 was reduced. When the temperature of the furnace assumed 150° C. or lower after further cooling the furnace, the argon gas was released to reduce the pressure. After a room temperature was substantially achieved, the high-pressure container 1 was opened to dismount the airtight container 20 therefrom and the crucible 14 was removed from the airtight container 20.

The ZnSe crystal thus obtained was a yellow, transparent crystal which as a whole was considered to be a single grain, though it partially contained a twin crystal. A weight variation of about 0.1% was measured.

In the above operation of growing a single crystal, ZnSe is dissociated until the pressures of Zn and Se vapors reach respective equilibrium vapor pressures in the airtight container 20. The respective equilibrium vapor pressures are as large as about 2.5 kgf/cm$^2$ for Zn and about 0.9 kgf/cm$^2$ for Se at the melting point of 1526° C. Therefore, if the airtight container 20 remains in a hermetical state, a force resulting from the pressure difference between the inside and outside of the airtight chamber 20 will be exerted thereon.

With the foregoing arrangement, however, the pressure difference between the inside and outside of the airtight container 20 seldom occurs for the following reason. For example, if the pressure inside the airtight chamber 20 becomes lower than the outside pressure, i.e., if the pressure in the lower space B becomes lower than the pressure in the upper space A in FIG. 6, a resulting force presses the molten sealing agent 27 toward the space B rather than toward the space A. When the molten sealing agent 27 reaches the lower end of the minute hole 23a, the gas is allowed to flow, thereby preventing an increase in pressure difference. Conversely, if the pressure in the lower space B becomes higher than the pressure in the upper space A due to the vapor pressure of Zn resulting from the dissociation of ZnSe by heating or to the thermal expansion of the inert gas, the liquid level of the sealing agent 27 varies to allow the inert gas mixed with Zn vapor to be released from the inside through the minute hole 23a, thereby similarly preventing an increase in pressure difference. Consequently, an excessively large force resulting from the pressure difference between the inside and outside of the airtight container 20 is not exerted thereon, which prevents damage to the airtight container 20.

Further, the diffusive movement of the dissociated components due to the concentration difference between vapors of the dissociated components is prevented by the above sealing agent 27. For example, if the vapor pressure of Zn is 2.5 kgf/cm$^2$ inside and 0 kgf/cm$^2$ outside and hence there is a difference in vapor pressure, the liquid level of the sealing agent 27 does not vary so long as the total pressure inside is equal to the total pressure outside, so that the sealing agent functions as a barrier. As a result, the diffusive movement of the vapors between the inside and outside spaces due to a difference in vapor pressure does not occur.

As described above, the pressure of the inert gas contained in the high-pressure container 1 is sufficient provided that it is equal to or higher than the dissociation pressure of a compound semiconductor material of interest. However, the pressure of the inert gas is preferably higher since, if it is equal to the dissociation pressure, the gas containing the dissociated component at a high concentration is allowed to flow out of the airtight container 20 via the open/close valve means 30, so that the component in the airtight container 20 will be decreased in the course of long-term operation, resulting in a single crystal of varied composition. For example, where ZnSe is heated to a temperature in the vicinity of its melting point under the pressure of the inert gas at 100 kgf/cm$^2$ or higher, Zn that flows out is only 3% or lower even when the maximum vapor pressure of Zn resulting from the dissociation of ZnSe is 3 kgf/cm$^2$, so that it can be concluded that a variation in vapor pressure caused by Zn that flows out is suppressed to an extremely small level.

The dissociated component thus flown out of the airtight container 20 flows in the natural convection of the inert gas in the airtight chamber 4, since the airtight container is enclosed by the airtight chamber 4 from above. Eventually, the dissociated component moves downward along the inner surface of the airtight chamber 4 to the pressure equalizing passage 10 provided in the lower portion of the airtight chamber 4, similarly to the above individual embodiments. Since the pressure equalizing passage 10 is located in a temperature zone in which the temperature is lower than the melting point of the dissociated component, the dissociated component is precipitated in droplets or in solids in the lower end portion of the airtight chamber 4. The amount of precipitation varies depending on the amount of the source material or on the pressure. In either case, the dissociated gas component is prevented from flowing out of the airtight chamber 4.

Thus, since the pressure difference between the inside and outside of the airtight container 20 is suppressed to a small level in the present embodiment, the airtight container 20 is not damaged even when its strength at high temperatures is not so high. Moreover, since the dissociated component flown out of the airtight container 20 is minimized in amount and is not allowed to flow out of the airtight chamber 4, the inside of the high-pressure container 1 is kept uncontaminated by the dissociated component, thereby preventing precipitation on the heater assembly 3 and on members for supplying power thereto and hence an accident resulting from a short circuit.

Figure 15:
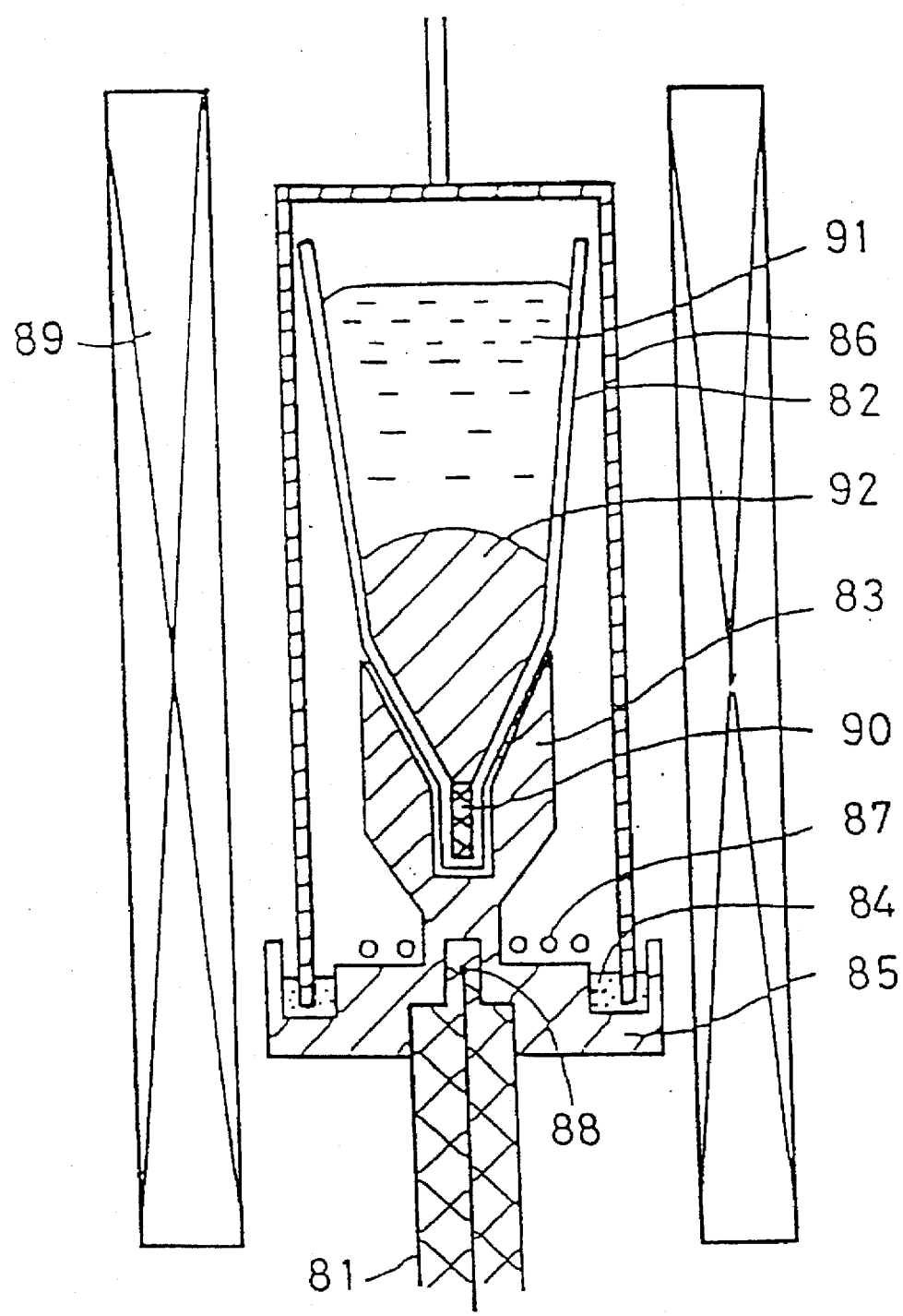
FIG. 15 is a vertical sectional view showing the internal structure of a conventional apparatus for preparing compound single crystals.

In the above apparatus disclosed in Japanese Unexamined Patent Publication HEI 3-247582, since boric oxide used as a liquid sealing agent has a melting point of about 450° C., it is solidified when the temperature thereof becomes equal to or lower than the melting point in the cooling process, so that the inner chamber 86 and the susceptor 83 shown in FIG. 15 adhere to each other. Consequently, it becomes difficult to remove the crucible 82 after completing the operation of crystal growth. To avoid the difficulty, it becomes necessary to lift up the inner chamber 86 at a high temperature in the course of cooling before the boric oxide is solidified and hold it separated from the susceptor 83. In the mean time, an increased amount of dissociated component flows out of the inner chamber 86 and contaminates the inside of the furnace.

In the present embodiment, however, the sealing agent container 22 for containing the liquid sealing agent 27 is mechanically fastened to the main body 21 by means of the fastening ring 24 and screw cap 25 at its upper end portion apart from the sealing agent 27. Therefore, the fastening structure remains unaffected even when the liquid sealing agent 27 once liquefied is solidified in the cooling process. Consequently, the present embodiment enables the cooling process to be continued till a room temperature is substantially achieved while keeping the airtight container 20 in a hermetical state. This suppresses the evaporation and diffusion of the dissociated component as well as facilitates the removal of the crystal grown.

Moreover, since the conical member 23 in the form of an inverted cone is centrally formed with the minute hole 23a to be closed by the liquid sealing agent 27, the amount of the liquid sealing agent 27 to be charged can be minimized, while the whole apparatus can further be reduced in size.

Embodiment 6

Below, a description will be given to still another embodiment of the present invention with reference to FIGS. 7 and 8.

Figure 7:
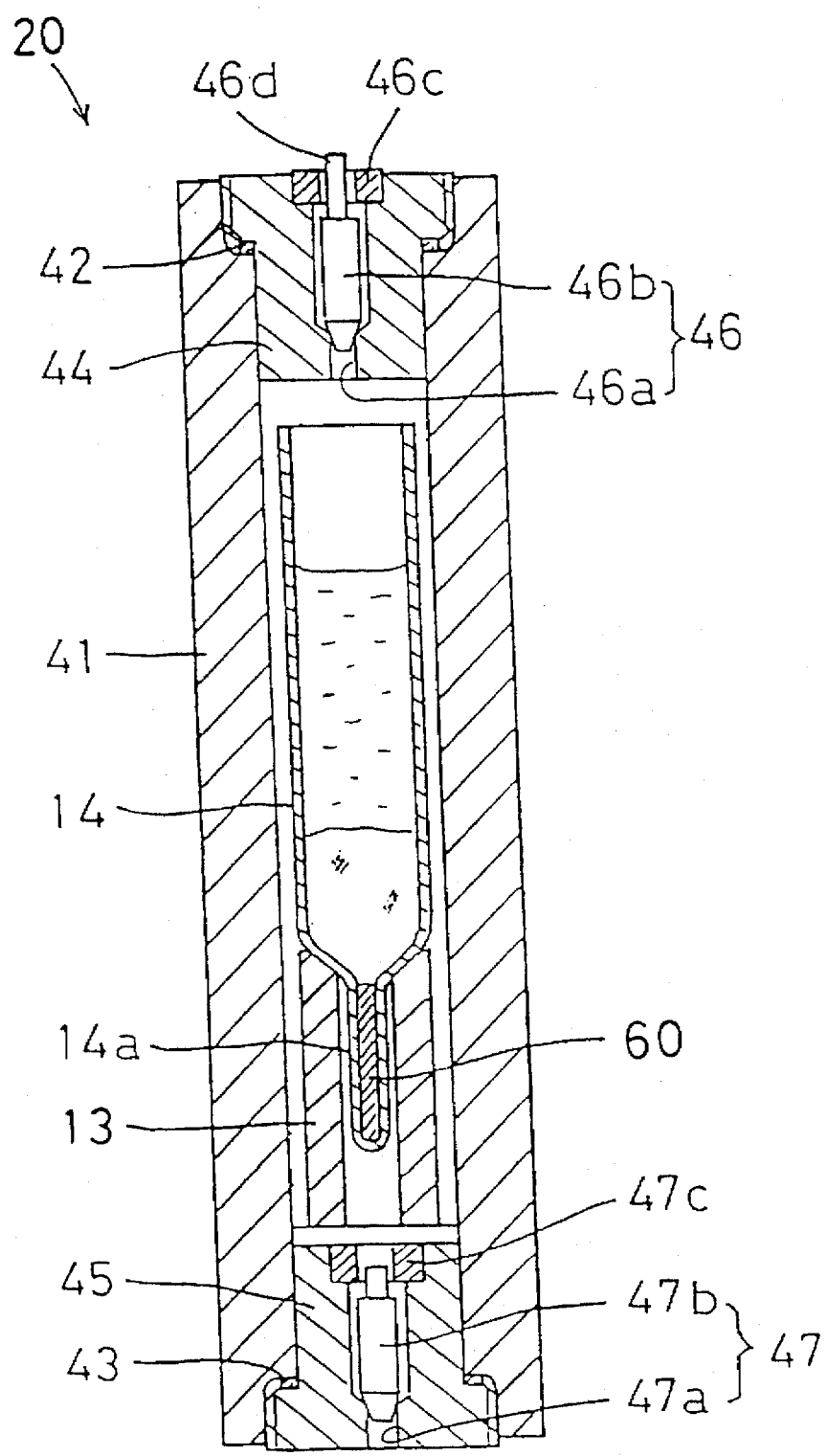
FIG. 7 is a vertical sectional view of an airtight container in Embodiment 6.

FIG. 7 shows the structure of airtight container 20 used in the present embodiment. The airtight container 20 includes a space for accommodating reservoir 17 for containing high-dissociation-pressure component 16 at the lower end portion of crucible support 13 disposed therein. The space for accommodating the reservoir 17 communicates with the space above the crucible support 13 in which the crucible 14 is placed via a clearance 31 between the outer circumferential surface of the crucible support 13 and the inner circumferential surface of the main body 21. To the upper portion of the main body 21 are fixed the sealing agent container 22 and conical member 23 by means of fastening ring 24 and screw cap 25, as in Embodiment 5.

Figure 8:
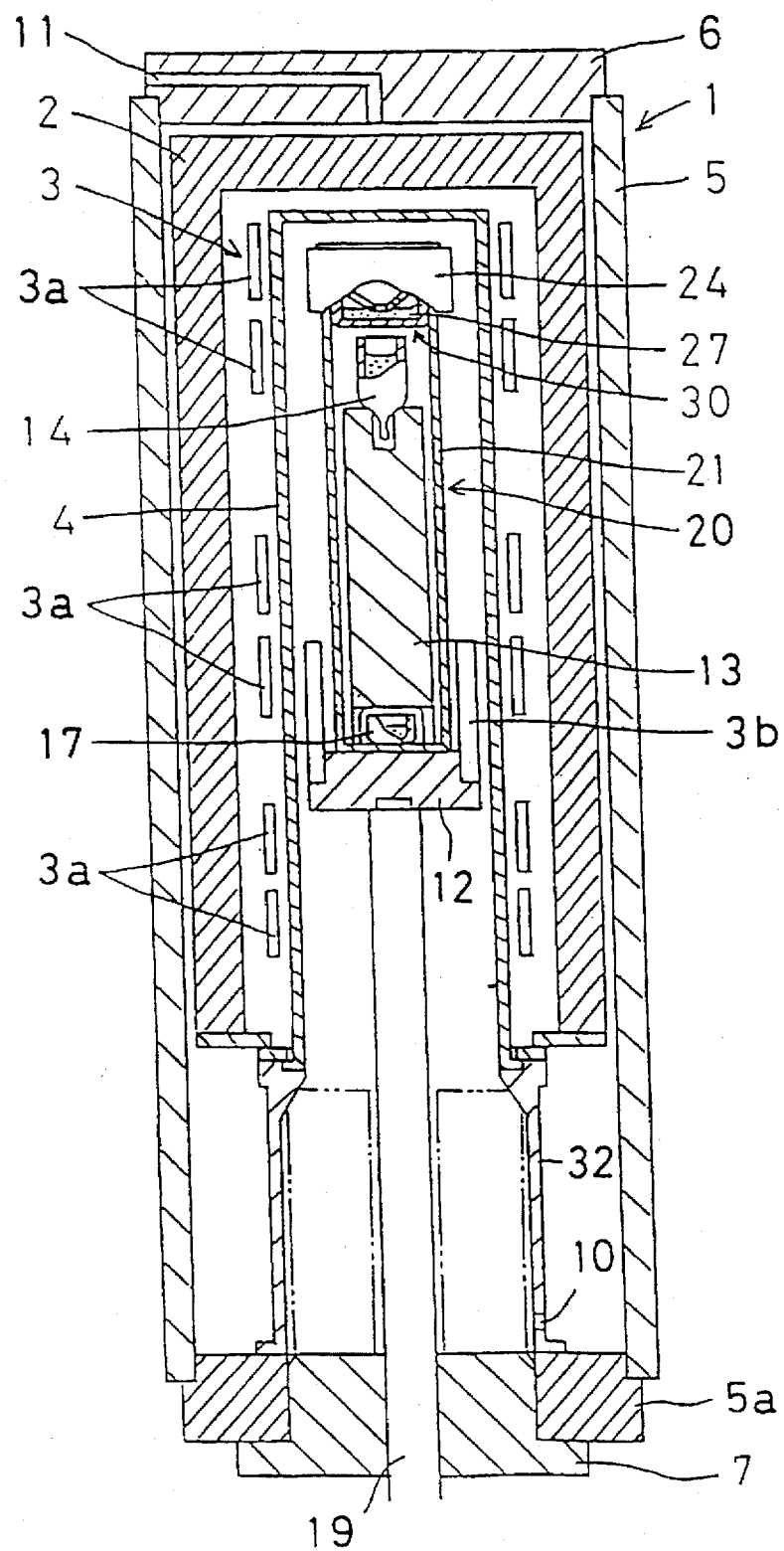
FIG. 8 is a vertical sectional view of an apparatus for preparing compound single crystals in Embodiment 6.

The airtight container 20 thus constructed is set in a preparing apparatus compliant with the vertical Bridgman method shown in FIG. 8. In the apparatus, the lower end opening of the cylindrical body 5 has substantially the same feature as that of the apparatus described in Embodiment 3 (see FIG. 4). On the bottom ring member 5a around which the cylindrical body 5 is fitted is provided a cylindrical chamber holder 32 in an upright fashion along the inner periphery of the bottom ring member 5a. The upper end portion of the chamber holder 32 supports the heat insulating structure 2 and the airtight chamber 4. The lower end portion of the chamber holder 32 is formed with pressure equalizing passage 10 for providing communication between the inner space enclosed by the holder 32 and the airtight chamber 4 mounted thereabove and the outer space.

The heater assembly 3 provided outside the airtight chamber 4 includes three pairs of upper and lower heater elements 3a disposed in upper, middle, and lower positions inside the heat insulating structure 2. Electric power supplied to the heater elements 3a is controlled to hold the inside of the airtight chamber 4 in a predetermined temperature distribution with the temperature increasing with ascending position.

On the upper end of lifting rod 19 extending through the center of the lower lid 7 is mounted pedestal 12. To the outer periphery of the pedestal 12 is attached heater 3b for heating reservoir so as to heat the lower end portion of the airtight container 20 placed on the pedestal 12. As a result, even when the height of the airtight container 20 in the airtight chamber 4 is changed by raising or lowering the lifting rod 19 so as to control the temperature of the upper part of the airtight container 20, i.e., the temperature of the part in which the crucible 14 is placed, the temperature of the reservoir 17 is controlled independently of the region around the crucible 14 by means of the heater 3b for heating reservoir which moves upward and downward cooperatively with the pedestal 12 in the vicinity of the part accommodating the reservoir 17. Although it is preferable for crucible 13 to have a small heat conductivity in order to keep a temperature difference constant in controlling the temperature of the reservoir 17 independently of the temperature of the crucible 14, it is also possible to use a material which has a small specific gravity and is not conspicuously porous, such as graphite, for the material of the crucible 13.

With the apparatus thus constructed, the mounting and dismounting of the airtight container 20 in the procedures of growing a single crystal can be performed by the operation of lowering only the lower lid 7. In the normal state except in maintenance and inspection, the apparatus is operated with the chamber holder 32 on the bottom ring member 5a, the airtight chamber 4 disposed thereon, and the heater assembly 3 disposed outside thereof being left in the high-pressure container 1.

A description will be given to specific procedures in preparing a ZnSe single crystal using the above airtight container 20 and apparatus and to an example of the result.

Initially, seed crystal 60 and source material similar to those used in Embodiment 5 were placed in the crucible 14, while the reservoir 17 was charged with 5 g of zinc. Thereafter, the airtight container 20 was set in the high-pressure container 1 as shown in FIG. 8 and the inner atmospheric gas was replaced. Then, heating was initiated while maintaining the pressure of the argon gas supplied into the high-pressure container 1 at 75 kgf/cm$^2$.

The source material was melted by locating the upper portion of the airtight container 20, i.e., the region in which the crucible 14 was placed at a temperature gradient of 5° C./cm in the vicinity of 1526° C., which is the melting point of ZnSe. Thereafter, the airtight container 20 was moved downward at a rate of 3 mm/hour to allow a crystal to grow from the melt. Although the composition of the single crystal can be controlled intentionally by varying the vapor pressure of the dissociated component from the equilibrium pressure, the present embodiment held the region in which the reservoir 17 was placed at 1030° C. in order to set the lower part of the airtight container 20, i.e., the reservoir 17 at a temperature in the vicinity of 1000° C., since the composition of Zn:Se=1:1 was intended. After completing such crystal growing operations, the initial pressure and temperature were restored and the crystal thus grown was recovered.

The crystal obtained was a transparent, yellow crystal with a slight green tint, which was judged to be a single grain, though a twin crystal was observed. No weight variation was measured. The resistivity of the sample was measured to be about 5 Ω cm, which is considerably low.

In the present embodiment, vapor of the dissociated component corresponding to the dissociation pressure of the source material in the upper portion of the airtight container 20 is generated by dissociation in the reservoir 17. Consequently, the dissociation of the source material and of the crystal under growing is minimized, resulting a crystal grown as having the intended composition.

Figure 9:
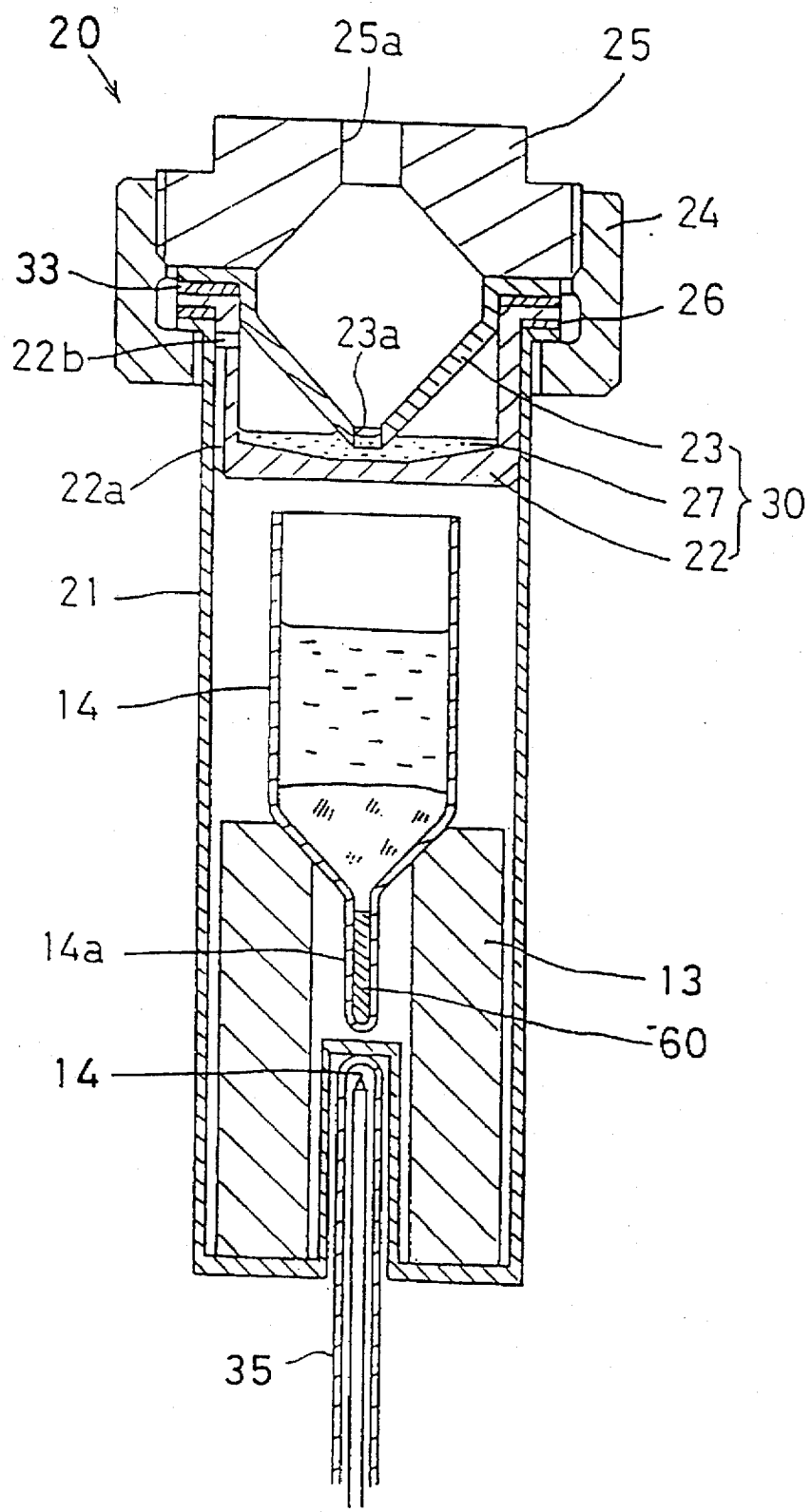
FIG. 9 is a vertical sectional view showing a variation of an airtight container containing a liquid sealing agent therein.

Although in each of Embodiments 5 and 6 the sealing agent container 22 and the conical member 23 are joined to each other by welding, it is also possible to interpose a seal ring 33 between the respective peripheral flange portions of the sealing agent container 22 and conical member 23 and fasten them, as shown in FIG. 9. In this case, the charging of the sealing agent 27 into the sealing agent container 22 is facilitated, while the cleaning operation after use is also facilitated.

If the bottom face of the sealing agent container 22 is designed to have a central portion lower in level, the liquid level sufficient to close the minute hole 23a of the conical member 23 is attained even when the amount of the sealing member 27 is reduced. As the sealing agent 27, a material having a low vapor pressure is preferred. Although various materials such as metal gallium can be used, $B_2O_3$ having a melting point of about 450° C. and convenient in handling is advantageously used.

It is also possible to adopt an arrangement such as to allow thermocouple (temperature measuring means) 34 to be inserted into the main body 21 and placed adjacent the thin tube 14a at the lower end of the crucible 14. In this case, since the thermocouple 34 deteriorates when exposed to the vapor of the source material from which a crystal is to be grown, the bottom wall of the main body 21 is formed with a thin recessed portion extending to a position adjacent the lower end of the crucible 14 so as to place the thermocouple 34 in the recessed portion. The thermocouple 34 is set in the state in which it is accommodated in a protective tube 35 made of a ceramic such as aluminum or a heat-resistant metal such as molybdenum.

With the provision of the thermocouple 34, it becomes possible to monitor the temperature so that the seed crystal 60 is not melted when the source material is melted before initiating the crystal growing operation and to monitor the temperature during crystal growth.

Embodiment 7

Below, a description will be given to still another embodiment of the present invention with reference to FIGS. 10 and 11.

Figure 10:
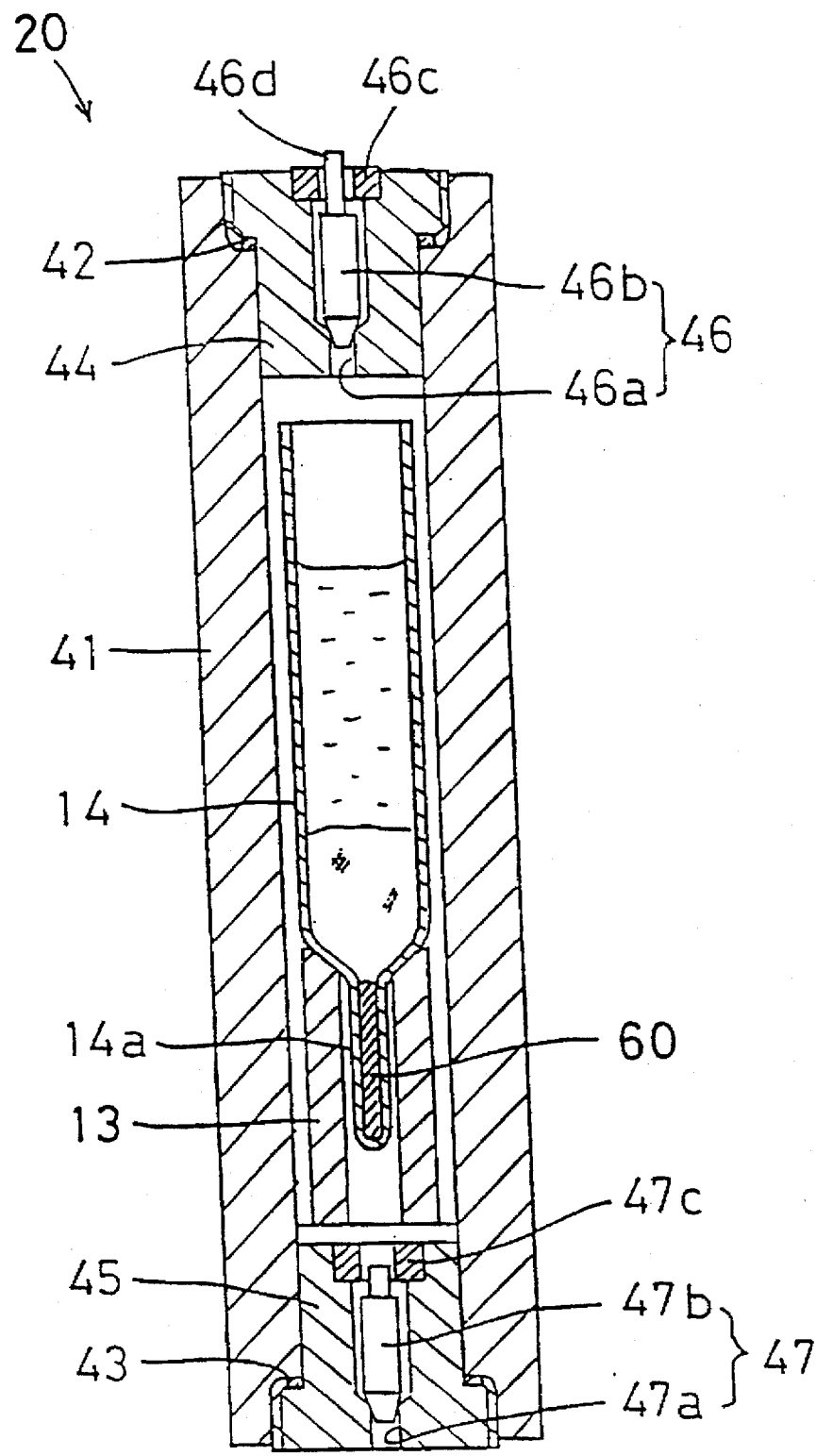
FIG. 10 is a vertical sectional view showing an airtight container in Embodiment 7.

FIG. 10 shows airtight container 20 used in the present embodiment. The airtight container 20 includes a main body 41 in the form of a cylinder having a vertically extending hollow, and upper and lower plugs 44 and 45 threadingly attached to and closing the upper and lower ends of the main body 41 with sealing members 42 and 43 interposed therebetween, respectively. The upper plug 44 is provided with a first check valve 46 composed of a communicating passage 46a vertically extending through the center thereof and a valve element 46b vertically movably inserted in the communicating passage 46a.

When the pressure in the airtight container 20 is equal to or lower than the outside pressure, the tapered lower end of the valve element 46b of the first check valve 46 is pressed downward by its own weight and held in contact with the shoulder portion of the communicating passage 46a having a smaller diameter, so that the first check valve 46 is kept in a closed position with the communicating passage 46a being blocked. On the other hand, when the pressure in the airtight chamber 20 becomes higher than the outside pressure, the valve element 46b is pressed upward against its own weight and the above tapered lower end is brought away from the shoulder portion having a smaller diameter, thereby opening the communicating passage 46a. This brings the first check valve 46 to an open position and allows the gas to flow from the airtight container 20 to the outside.

To prevent the valve element 46b from slipping off upward during such an operation, a stopper element 46c is attached to the upper end portion of the communicating passage 46a. In addition, the upper end of the valve element 46b is provided with a guide pin 46d in the form of a thin rod which extends through the central hole of the stopper element 46c and protrudes upward. A pressure difference required to lift the valve element 46b into the open position (cracking pressure) can be controlled by loading an additional weight or the like on the upper end of the guide pin 46d.

Likewise, the lower plug 45 is provided with a second check valve 47 composed of a communicating passage 47a formed therein and a valve element 47b for opening and closing the communicating passage 47. To prevent the valve element 47b from slipping off upward, a stopper element 47c is attached to the upper end portion of the communicating passage 47a. The valve element 47b is pressed downward into an open position when the pressure in the airtight container 20 becomes lower than the outside pressure, which allows the outside gas to flow into the airtight container 20.

On the lower plug 45 is disposed crucible support 13 which supports the crucible 14 in an upright fashion.

Figure 11:
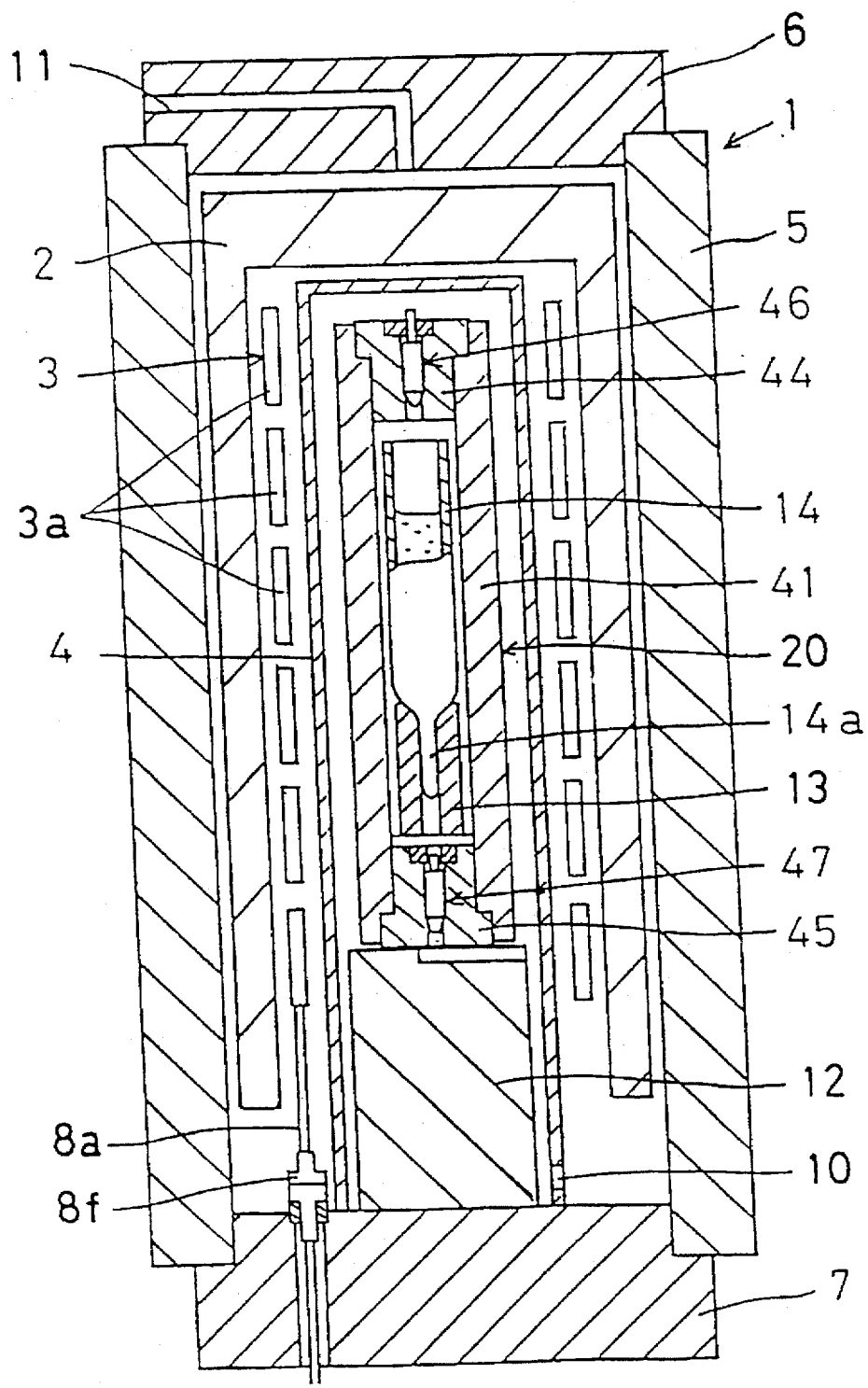
FIG. 11 is a vertical sectional view of an apparatus for preparing compound single crystals in Embodiment 7.

As shown in FIG. 11, the airtight container 20 is set in a preparing apparatus which is substantially similar in structure to the apparatus for preparing single crystals compliant with the vertical gradient freeze solidifying method used in Embodiment 5 (see FIG. 5).

A description will be given to the procedures in preparing a ZnSe single crystal using the preparing apparatus thus constructed and to an example of the result.

Initially, the crucible 14 charged with seed crystal 60 and ZnSe source material, which are similar to those used in the Embodiment 5, were placed in the airtight container 20, which was then installed as shown in FIG. 11. Thereafter, the high-pressure container 1 was evacuated through the gas supply/exhaust passage 11, followed by the replacement of the inner atmosphere by supplying an argon gas at 5 kgf/cm$^2$ into the high-pressure container 1. Subsequently, the argon gas was filled at 300 kgf/cm$^2$.

Then, electric power was fed to the heater assembly 3 to initiate heating and heating temperature was controlled such that the temperature of the upper part of the airtight container 20 assumed 1550° C. and that the temperature of the lower part thereof assumed 1515° C. to keep the seed crystal 60 unmelted. At that time, the pressure in the high-pressure container 1 achieved 1200 kgf/cm$^2$. In turn, the temperature was lowered at a rate of 3.5° C./hour (about 10 hours at a growth rate of about 5 mm/hour) till the temperature of the upper part of the airtight container 20 assumed 1510° C., while keeping the above temperature gradient constant, thereby allowing a ZnSe crystal to grow upwardly from the source material melt from its bottom portion in contact with the seed crystal 60.

The electric power fed to the heater was reduced at the time when the whole melt was solidified and crystallized in the above operation. When the temperature assumed 150° C. or lower after further cooling the furnace, the argon gas was exhausted to reduce the pressure. After a room temperature was substantially achieved, the high-pressure container 1 was opened to dismount the airtight container 20, from which the crucible 14 was then removed.

The ZnSe crystal obtained was a yellow, transparent crystal which was be considered to be a single grain, though it partially contained a twin crystal. A weight variation of about 0.1% was measured.

During the above crystal growing operation in the present embodiment, the two check valves 46 and 47 provided in the airtight container 20 prevent an excessively large force resulting from the pressure difference from acting on the airtight container 20. Specifically, in supplying an inert gas into the high-pressure container 1, if the pressure outside the airtight container 20 becomes higher than the inside pressure and the pressure difference between the inside and outside of the airtight container 20 becomes equal to or higher than the cracking pressure of the second check valve 47, the inert gas is allowed to flow into the airtight container 20. On the other hand, if the pressure inside the airtight container 20 is increased due to the pressure of Zn vapor resulting from the dissociation of ZnSe heating or to the thermal expansion of the inert gas and the pressure difference between the inside and outside of the airtight container 20 exceeds the cracking pressure of the first check valve 46, the inert gas mixed with the Zn vapor is exhausted from the inside. As a result, the pressure difference between the inside and the outside of the airtight container 20 is constantly kept between the respective cracking pressures of the two check valves 46 and 47, which prevents damage to the airtight container 20.

Moreover, the airtight container 20 is enclosed by the airtight chamber 4 from above, the dissociated component that flows out of the airtight chamber 20 through the first check valve 46 in the upward direction flows toward the pressure equalizing passage 10 in the lower portion of the airtight chamber 4 and precipitated in droplets or in solids on the bottom portion of the airtight chamber 4, as in Embodiment 5. Since the dissociated gas component is thereby prevented from flowing out of the airtight chamber 4, an accident resulting from a short circuit which would otherwise be caused by precipitation on the heater assembly 3 and on the members for supplying power thereto can be prevented.

Figure 12:
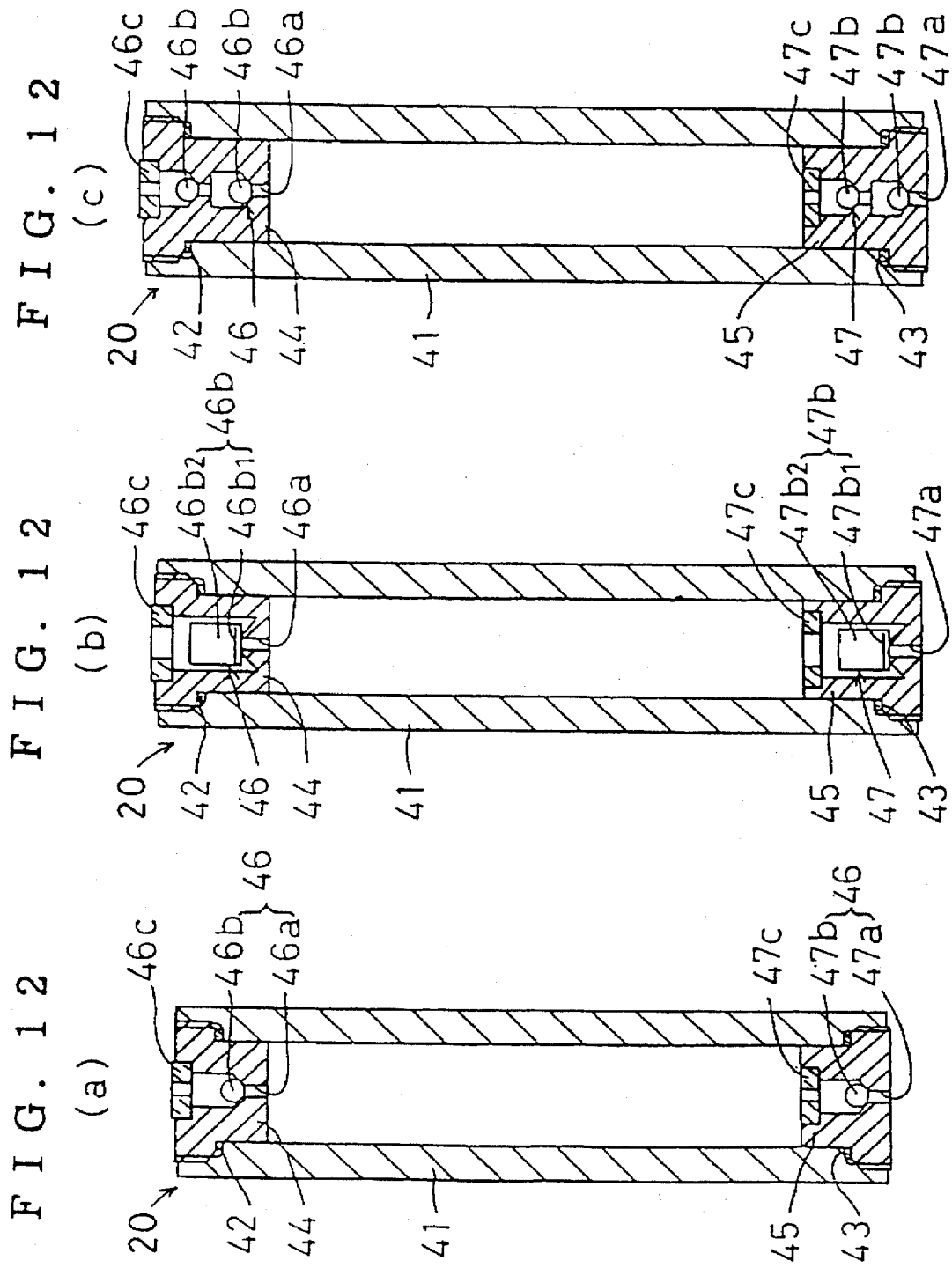
FIGS. 12(a), 12(b), and 12(c) are each a vertical sectional view showing a variation of the airtight container.

Although the above embodiment is constructed including the first and second check valves 46 and 47 which are incorporated with the respective valve elements 46b and 47b having tapered lower ends, the first and second check valves 46 and 47 can also be adapted to have spherical valve elements 46b and 47b, as shown in FIG. 12(a), or the valve elements 46b and 47b comprising soft sealing plates $46b_1$ and $47b_1$ and weights $46b_2$ and $47b_2$, as shown in FIG. 12(b). In the latter case, the soft sealing plates $46b_1$ and $47b_1$ are pressed onto valve seats with sharp-pointed tops provided in the communicating passages 46a and 47a.

Since the above check valves 46 and 47 are for use at high temperatures equal to or higher than 1000° C. as described above, it is difficult to use a spring for loading for bringing the valves into the open positions. By constituting the valves 46b and 47b such that their own weights determine the cracking pressures for bringing them into the open positions, the structures thereof are simplified, while stable operation at high temperatures is assured.

With the valve elements 46b and 47b shown in FIG. 12(b), the weights $46b_2$ and $47b_2$ are selected based on desired cracking pressures. FIG. 12(c) shows the first and second check valves 46 and 47 provided with a pair of spherical valve elements 26b and a pair of spherical valve elements 47b, respectively. This feature enables the cracking pressures to be further increased, while the intrinsic functions of the check values can be performed more assuredly.

In order to dispose the above check valves 46 and 47 which are adapted to keep their closed positions by their own weights in the airtight chamber 20 in the form of an elongated cylinder, it is effective to arrange the check valves 46 and 47 so that the gas is flown into the airtight chamber 20 from below and flown out of the airtight container 20 from an upper portion of the airtight chamber, as shown in the drawings, thereby minimizing a size increase accompanying the use of a check valve structure. However, the check valves 46 and 47 are not limited thereto.

Embodiment 8

Below, a description will be given to still another embodiment of the present invention with reference to FIGS. 13 and 14.

Figure 13:
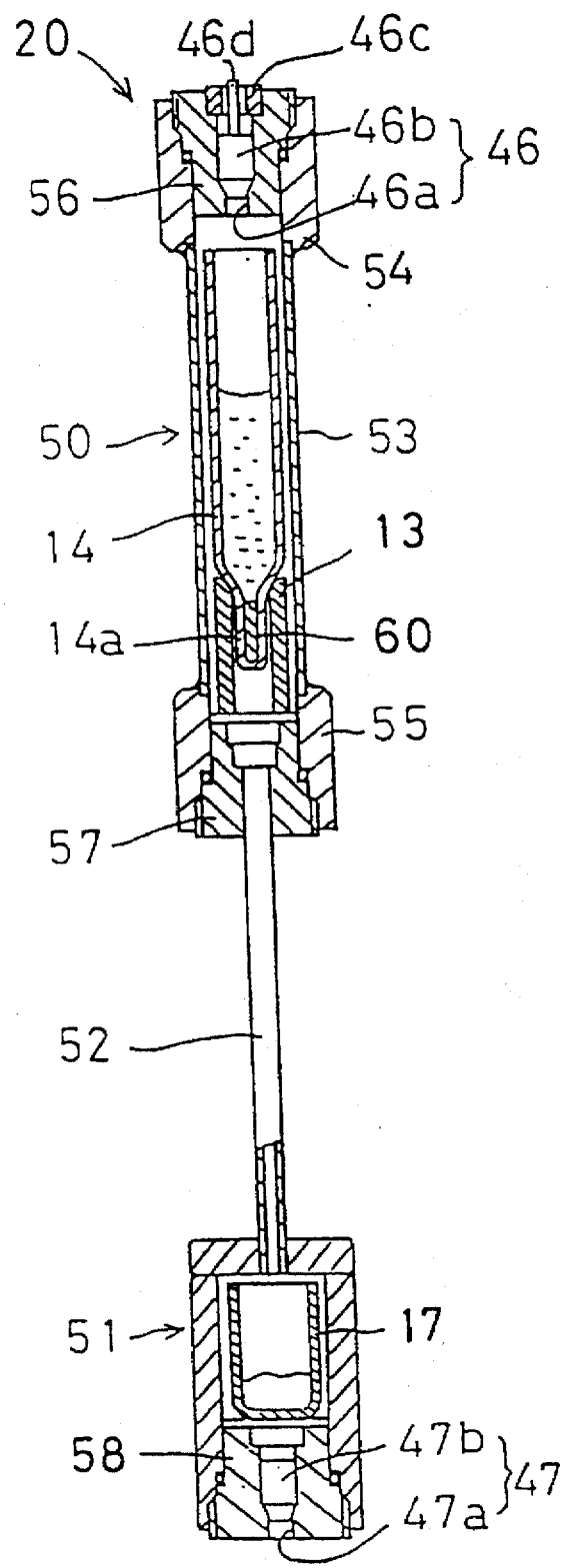
FIG. 13 is a vertical sectional view showing an airtight container in Embodiment 8.
Figure 14:
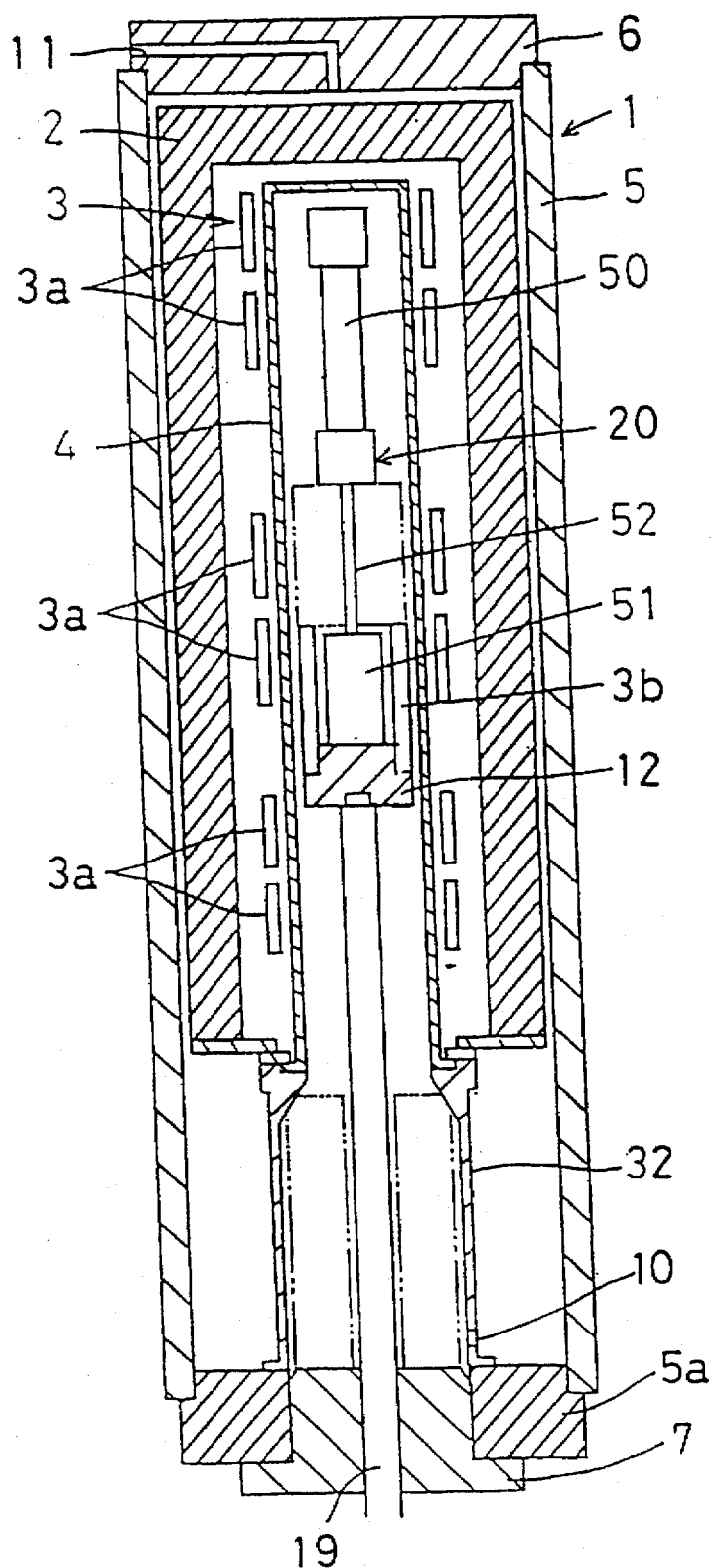
FIG. 14 is a vertical sectional view of an apparatus for preparing compound single crystals in Embodiment 8.

FIG. 13 shows the structure of airtight container 20 used in the present embodiment. In the airtight container 20, a growth container part 50 and a reservoir container part 51 are vertically connected to each other by means of a connecting pipe 52. In other words, reservoir 17 for containing only the dissociated component can be incorporated in the airtight container 20, similarly to Embodiment 6.

The growth container part 50 comprises: a cylindrical body 53; upper and lower rings 54 and 55 joined to the upper and lower ends of the body 53 by welding, respectively; and upper and lower plugs 56 and 57 threadingly attached to the rings 54 and 55, respectively, to hermetically close the respective central openings of the rings 54 and 55. The upper plug 56 is internally provided with first check valve 46 similar to that used in Embodiment 7. On the other hand, the upper end portion of the connecting pipe 52 is hermetically inserted in the central hole of the lower plug 57. In the growth container part 50 is provided crucible support 13, which receives crucible 14.

The reservoir container part 51 connected to the lower end portion of the connecting pipe 52 by welding accommodates reservoir 17 containing a dissociated component. By heating the reservoir 17, vapor of the dissociated component having a vapor pressure corresponding to the heating temperature is generated. Since the reservoir container part 51 communicates with the growth container part 50, the vapor pressure of the dissociated component in the growth container part 50 is controlled to coincide with the vapor pressure in the reservoir container part 51.

To the reservoir container part 51 is threadingly attached a reservoir container plug 58 so as to hermetically close the lower end thereof. The reservoir container plug 58 is provided with second check valve 47 similar to that used in Embodiment 7.

Most parts of the airtight container 20 are composed of a metal having a high melting point such as molybdenum. This is because molybdenum is readily available as a material impervious to gas and a hermetical structure can easily be implemented by welding molybdenum. It will be appreciated that the airtight container 20 may be composed of a hermetic carbon material, boron nitride or the like.

The airtight container 20 of the above structure is set in an apparatus having the same structure as that of the preparing apparatus compliant with the vertical Bridgman method described in Embodiment 6 (see FIG. 8).

A description will be given to crystal preparing procedures performed using the above apparatus and an example of the result.

Initially, the crucible 14 charged with seed crystal 60 and source material, which were similar to those used in Embodiment 5, were placed in the growth container part 50 of the airtight chamber 20, while the reservoir 17 was charged with 5 g of Zn. After setting the airtight container 20 in high-pressure container 1, inner Gas replacement was performed using an argon gas. Thereafter, the pressure of the supplied argon gas was set to about 75 kgf/cm$^2$ and held constant.

After melting the source material in the growth container part 50 in this state, the growth container part 50 was placed at a temperature gradient of 5° C./cm in the vicinity of the melting point of 1526° C., while the airtight chamber 20 was moved downward at a rate of 3 mm/hour, thereby allowing a ZnSe single crystal to grow. At this time, the temperature of the reservoir container part 51 was kept at 1030° C.

After completing the crystal growing operation, the initial pressure and temperature were restored, followed by the recovery of the crystal thus grown from the crucible 14.

The crystal obtained was a yellow, transparent crystal with a slight tint of green, which as a whole was judged to be a single grain, though a twin crystal was observed. No weight variation was measured. The resistivity of the grown crystal was measured to be about 5 Ω cm, which was considerably low.

In the present embodiment, the dissociation of the source material and the crystal under growing is also minimized by generating the vapor of the dissociated component at a pressure corresponding to the dissociation pressure in the reservoir 17, as in Embodiment 6, resulting in a crystal of the intended composition.

Comparative Example 1

The operation of growing a ZnSe single crystal was performed using the same apparatus as used in Embodiment 5 (see FIGS. 5 and 6) in accordance with the same procedures and under the same conditions as in Embodiment 5, except that the sealing agent was not introduced into the sealing agent container 22.

The grown crystal thus obtained presented a considerable weight reduction which was visible even to the naked eyes and a metallic black color. A weight reduction of about 20% was measured. On the inner surface of the lower part of the chamber in the form of an inverted cup was precipitated powdery material which was yellow and reddish in color and had an unpleasant smell suggestive of a selenium compound.

Comparative Example 2

The operation of growing a ZnSe single crystal was performed using the apparatus used in Embodiment 7 (see FIGS. 10 and 11) in accordance with the same procedures as performed in Embodiment 7, while holding the first check valve 46 of the upper plug 44 in the open position.

The grown crystal thus obtained presented a considerable weight reduction visible even to the naked eyes and a metallic black color. A weight reduction of about 20% was measured. On the inner surface of the lower part of the chamber in the form of an inverted cup was precipitated powdery material which was yellow and reddish brown in color and had an unpleasant smell suggestive of a selenium compound.

As has been described, if the high-pressure container 1 as a furnace body has a sufficient strength in the foregoing Embodiments 5 to 8, the airtight container 20 for holding the vapor pressure of the high-dissociation-pressure component is not damaged even when a high pressure of, e.g., 1000 kgf/cm$^2$ is achieved by using the inert gas for pressurization. Hence, the preparing of a compound semiconductor single crystal having a high dissociation pressure at a high temperature in the vicinity of the melting point can be implemented by efficiently utilizing the pressure of a high-pressure inert gas. Moreover, it becomes possible to prevent the structure such as the heater assembly 3 in the furnace body from being contaminated. In addition, the arrangement of the present invention makes it possible to greatly facilitate the charging of the source material for crystal growth and the recovery of the grown single crystal, resulting in a significant contribution to the industrial use thereof.

The present invention is not limited to the embodiments described above and permits proper design modifications. For example, the number of stages of the heater elements 3a is not limited to those illustrated and can be set arbitrarily. Although ZnSe single crystal and GaAs single crystal are prepared in the above embodiments as examples, the present invention is also applicable to the preparation of single crystals of other compound semiconductors such as CdTe belonging to group II–VI and InP and GaP belonging to group III–V or of ternary compounds thereof, from which some of their components are likely to be dissociated and evaporated. The present invention is particularly advantageous in preparing a single crystal of a compound having a high-dissociation-pressure compound which has a molecular weight larger than that of an inert gas for pressurization.

The present invention provides a method and apparatus for preparing a single crystal of a compound from which some of their components are likely to be dissociated and evaporated at high temperatures during crystal growth, such as ZnSe and CdTe belonging to group II–VI and InP and GaP belonging to group III–V, or of ternary compounds thereof, which method and apparatus enable the preparation of high-quality compound single crystals and improve productivity, thereby achieving a great industrial contribution.

What is claimed is:

1. An apparatus for preparing compound single crystals comprising:

a source material container for containing a source material;

a hermetical furnace body incorporating therein a heating means for heating the source material container from therearound and formed with a gas supply/exhaust passage connected to the outside of the furnace body;

an airtight chamber impervious to gas which is disposed inside the heating means so as to enclose the source material container; and a pressure equalizing passage for providing communication therethrough between an internal space enclosed by the airtight chamber and the outside of the airtight chamber, the passage being formed in a lower portion of the airtight chamber which is held in a temperature zone equal to or lower than the melting point of a high-dissociation-pressure component.

2. An apparatus for preparing compound single crystals according to claim 1, wherein the furnace body comprises a cylindrical body and upper and lower lids for hermetically closing upper and lower openings of the cylindrical body, respectively, and the airtight chamber is attached to the lower lid removably mounted on the cylindrical body from below.

3. An apparatus for preparing compound single crystals according to claim 1, wherein the airtight chamber is of a disassemblable construction.

4. An apparatus for preparing compound single crystals according to claim 2, wherein the airtight chamber is of a disassemblable construction.

5. An apparatus for preparing compound single crystals according to claim 1, further comprising a lifting rod which is vertically movable in the airtight chamber, the source material container being supported by an upper portion of the lifting rod.

6. An apparatus for preparing compound single crystals according to claim 1, further comprising a reservoir for containing the high-dissociation-pressure component of the source material which is disposed in the airtight chamber at a height positioned between a region in which the source material container is disposed and the pressure equalizing passage, and a vapor-flow control means for preventing vapor of the high-dissociation-pressure component evaporated from the reservoir from flowing downward, the vapor-flow control means being disposed between the reservoir and the pressure equalizing passage.

7. An apparatus for preparing compound single crystals according to claim 1, further comprising an airtight container for containing the source material container in the airtight chamber, the airtight container being provided with an open/close valve means which opens and closes depending on a pressure difference between the inside and outside of the airtight container to form a gas flow path.

8. An apparatus for preparing compound single crystals according to claim 7, wherein the open/close valve means is provided with a liquid sealing agent which is for closing a communicating passage for providing communication between the inside and outside of the airtight container and is capable of forming the gas flow path in response to a variation in liquid level corresponding to the pressure difference between the inside and outside of the airtight container.

9. An apparatus for preparing compound semiconductor single crystals according to claim 7, wherein the open/close valve means comprises a first check valve which opens when the pressure in the airtight container becomes higher than the pressure outside thereof, and a second check valve which opens when the pressure in the airtight pressure becomes lower than the pressure outside thereof.

10. An apparatus for preparing compound single crystals according to claim 1, wherein the airtight container is internally provided with a reservoir for containing the high-dissociation-pressure component.

11. An apparatus for preparing compound single crystals according to claim 7, wherein the airtight container is provided with a temperature measuring part for accommodating a temperature measuring means for measuring the temperature of a region of the source material container in which a seed crystal is inserted.

* * * * *